(12) United States Patent
Chen et al.

(10) Patent No.: US 12,507,440 B2
(45) Date of Patent: *Dec. 23, 2025

(54) MULTI-LAYER CHANNEL STRUCTURES AND METHODS OF FABRICATING THE SAME IN FIELD-EFFECT TRANSISTORS

(71) Applicant: Taiwan Semiconductor Manufacturing Co., Ltd., Hsinchu (TW)

(72) Inventors: Guan-Lin Chen, Hsinchu County (TW); Kuo-Cheng Chiang, Hsinchu County (TW); Shi Ning Ju, Hsinchu (TW); Chih-Hao Wang, Hsinchu County (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/742,126

(22) Filed: Jun. 13, 2024

(65) Prior Publication Data

US 2024/0332391 A1 Oct. 3, 2024

Related U.S. Application Data

(63) Continuation of application No. 18/168,338, filed on Feb. 13, 2023, now Pat. No. 12,040,371, which is a
(Continued)

(51) Int. Cl.
*H01L 29/423* (2006.01)
*H01L 21/8234* (2006.01)
(Continued)

(52) U.S. Cl.
CPC ..... *H10D 30/6735* (2025.01); *H10D 30/6757* (2025.01); *H10D 62/822* (2025.01);
(Continued)

(58) Field of Classification Search
CPC ........... H10D 30/6735; H10D 30/6757; H10D 62/822; H10D 64/017; H10D 84/0128;
(Continued)

(56) References Cited

U.S. PATENT DOCUMENTS 9,601,569 B1 3/2017 Suk
11,581,415 B2 * 2/2023 Chen .................. H01L 29/78696
(Continued)

FOREIGN PATENT DOCUMENTS

KR 20170001950 A 1/2017
KR 20170067117 A 6/2017
(Continued)

OTHER PUBLICATIONS

Korean Patent, Application No. 10-2021-0037104, Korean Intellectual Property Office, Notice of Allowance of Patent, dated Apr. 10, 2023.

*Primary Examiner* — Tong-Ho Kim
(74) *Attorney, Agent, or Firm* — HAYNES AND BOONE, LLP

(57) ABSTRACT

A semiconductor structure includes a first stack of semiconductor layers disposed over a semiconductor substrate, where the first stack of semiconductor layers includes a first SiGe layer and a plurality of Si layers disposed over the first SiGe layer and the Si layers are substantially free of Ge, and a second stack of semiconductor layers disposed adjacent to the first stack of semiconductor layers, where the second stack of semiconductor layers includes the first SiGe layer and a plurality of second SiGe layers disposed over the first SiGe layer, and where the first SiGe layer and the second
(Continued)

SiGe layers have different compositions. The semiconductor structure further includes a first metal gate stack interleaved with the first stack of semiconductor layers to form a first device and a second metal gate stack interleaved with the second stack of semiconductor layers to form a second device different from the first device.

20 Claims, 35 Drawing Sheets

Related U.S. Application Data continuation of application No. 17/155,775, filed on Jan. 22, 2021, now Pat. No. 11,581,415.

(60) Provisional application No. 63/015,133, filed on Apr. 24, 2020.

(51) Int. Cl.
| | |
|---|---|
| *H01L 27/088* | (2006.01) |
| *H01L 29/165* | (2006.01) |
| *H01L 29/66* | (2006.01) |
| *H01L 29/786* | (2006.01) |
| *H10D 30/67* | (2025.01) |
| *H10D 62/822* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 64/017* (2025.01); *H10D 84/0128* (2025.01); *H10D 84/038* (2025.01); *H10D 84/83* (2025.01)

(58) Field of Classification Search
CPC .. H10D 84/038; H10D 84/83; H01L 29/0673; H01L 29/0847; H01L 29/1079; H01L 29/165; H01L 21/823842; H01L 29/161; H01L 29/41725; H01L 29/42376; H01L 29/42392; H01L 29/66545; H01L 29/78696; H01L 29/7848; H01L 27/092; H01L 29/66439; H01L 29/775; H01L 21/823807; H01L 27/0924; H01L 21/823821; B82Y 10/00
USPC ........................................................ 257/401
See application file for complete search history.

(56) References Cited

U.S. PATENT DOCUMENTS

| | | | |
|---|---|---|---|
| 12,040,371 B2* | 7/2024 | Chen | ................. H01L 29/41725 |
| 2015/0053928 A1 | 2/2015 | Ching | |
| 2017/0018462 A1 | 1/2017 | Suk | |
| 2019/0103317 A1 | 4/2019 | Yu | |
| 2020/0312658 A1* | 10/2020 | Miura | ................. H10D 84/0193 |
| 2021/0257480 A1* | 8/2021 | Jhan | ..................... H10D 62/118 |
| 2021/0336024 A1 | 10/2021 | Chen | |

FOREIGN PATENT DOCUMENTS

| | | |
|---|---|---|
| KR | 20180060948 A | 6/2018 |
| KR | 20190038282 A | 4/2019 |
| KR | 20190135544 A | 12/2019 |
| KR | 20200035896 A | 4/2020 |

\* cited by examiner

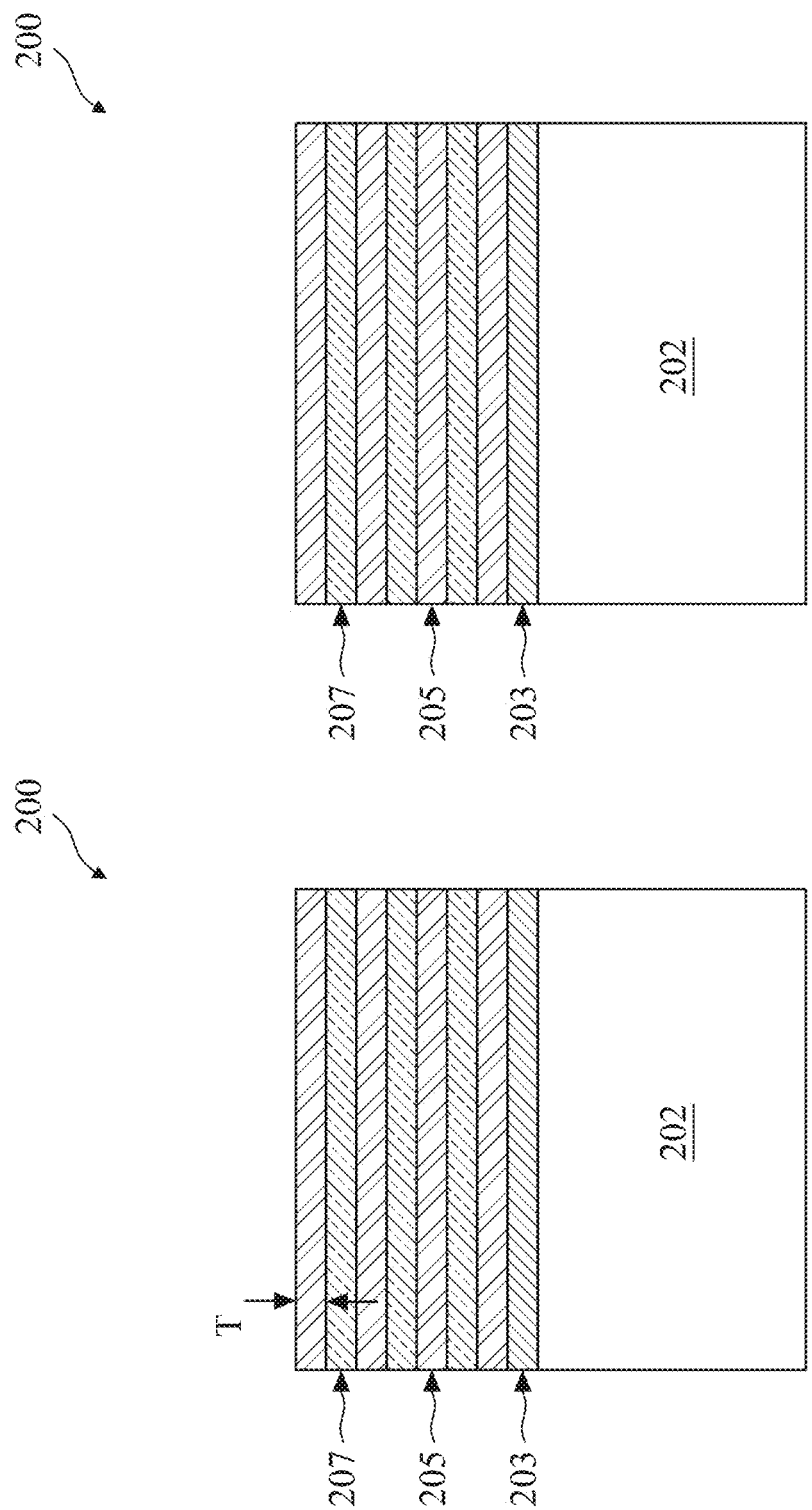

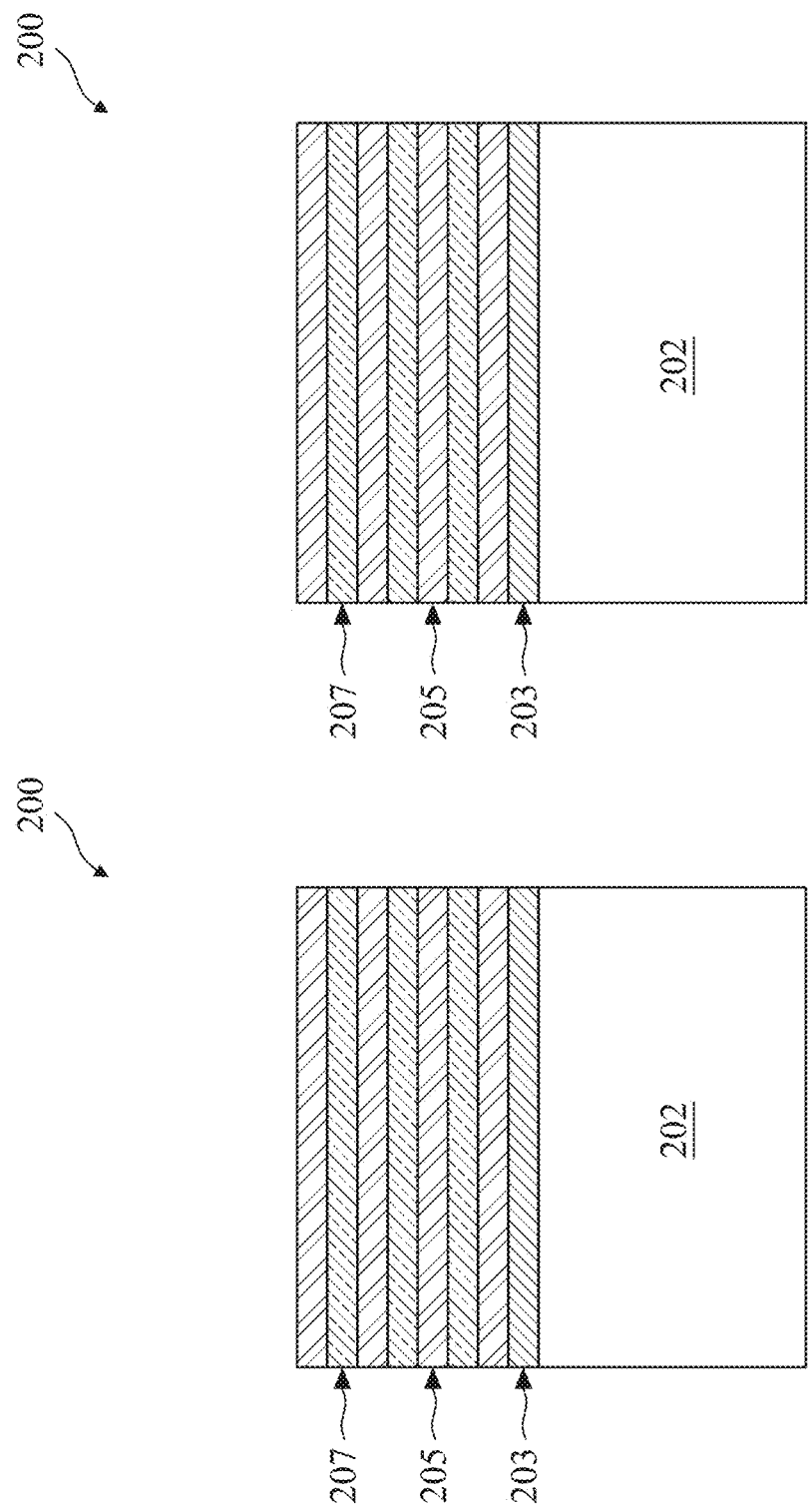

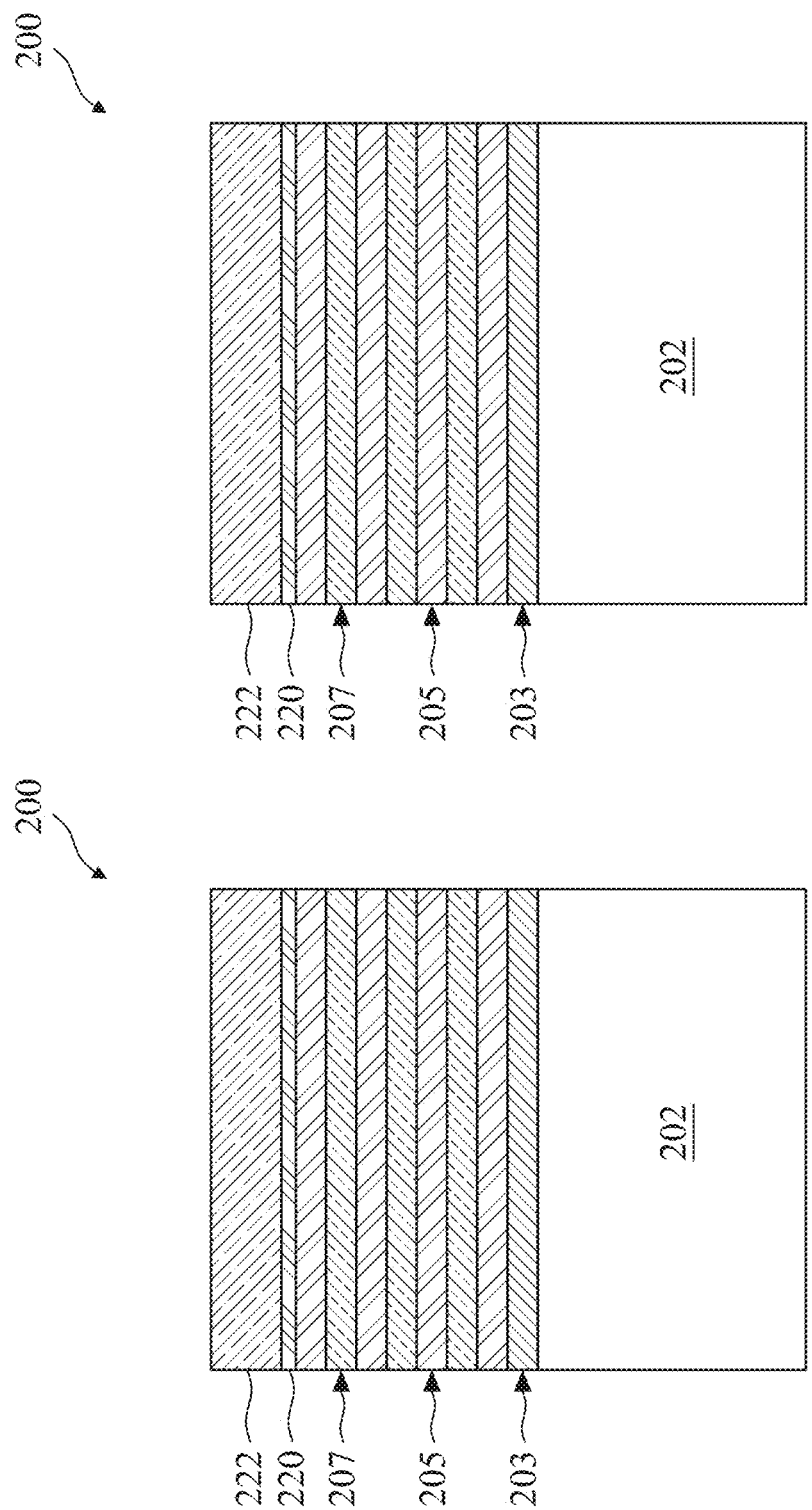

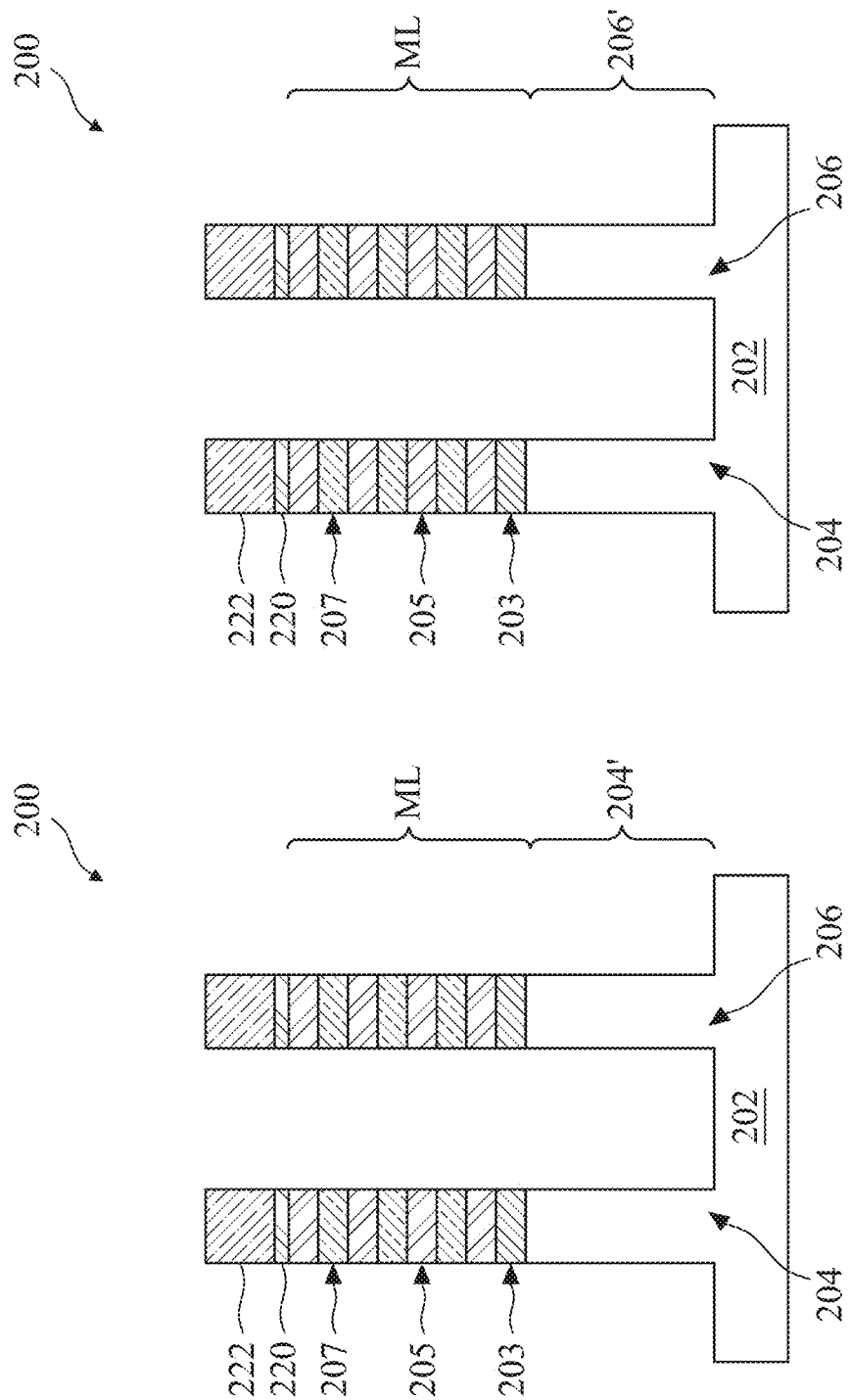

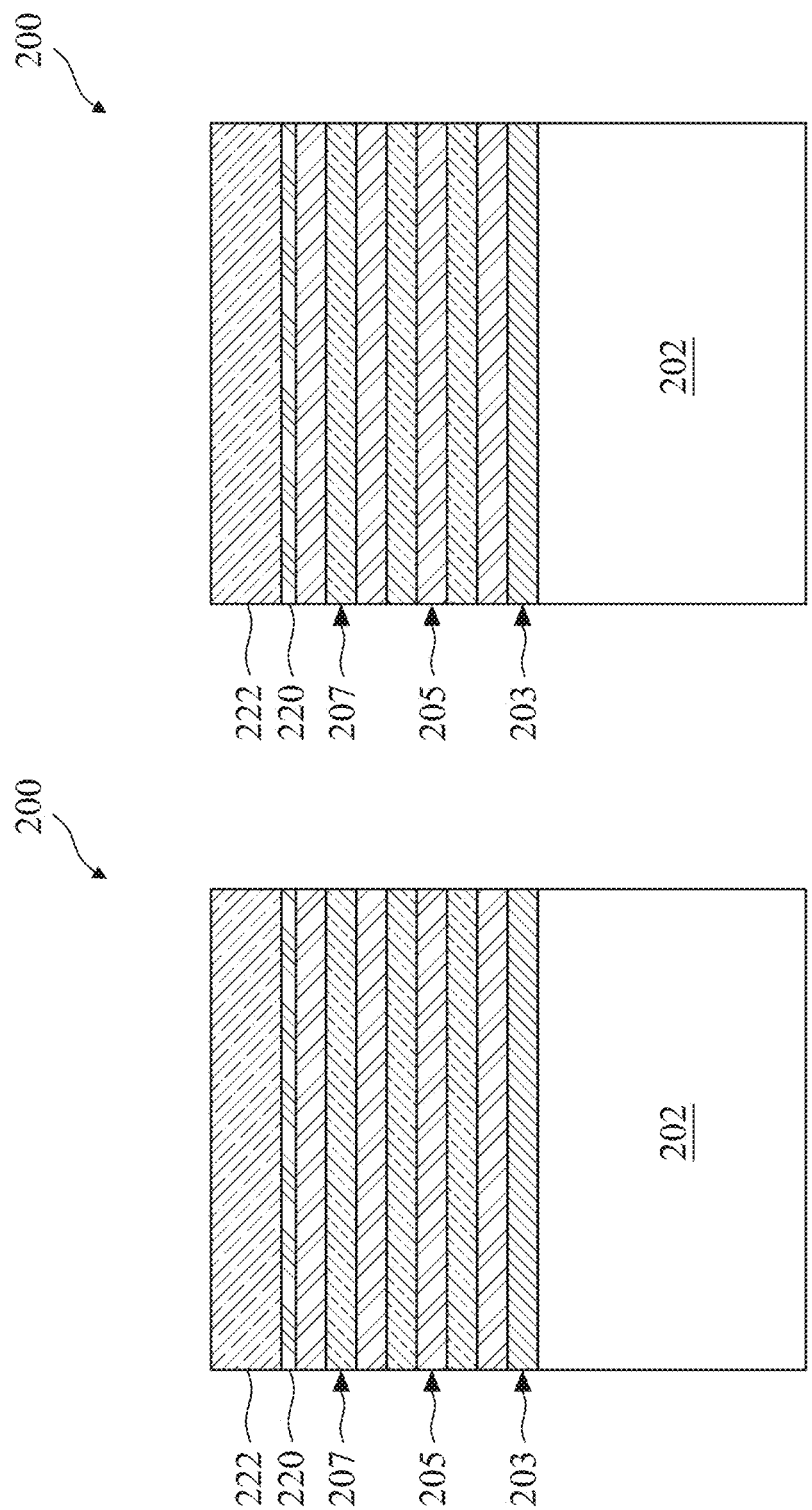

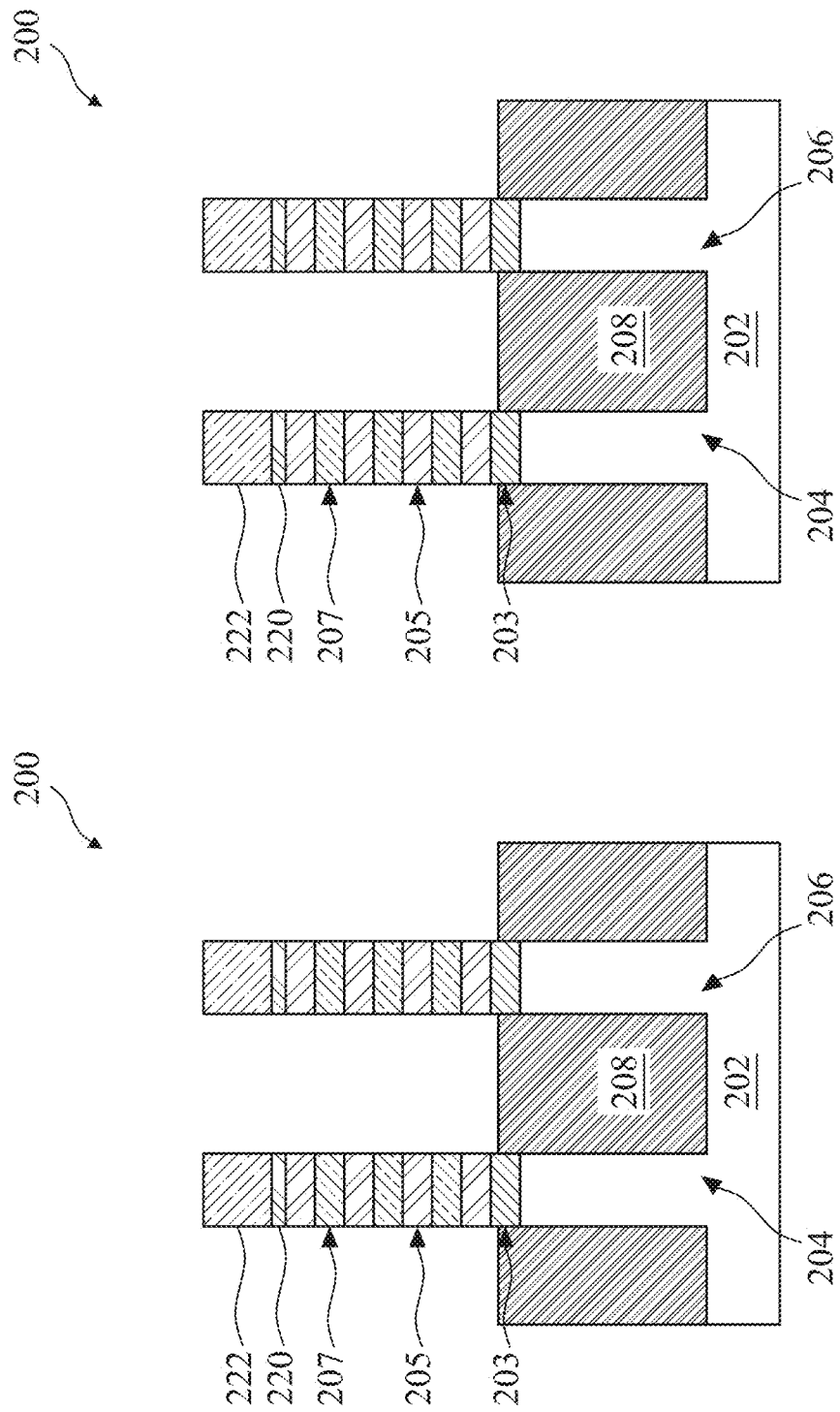

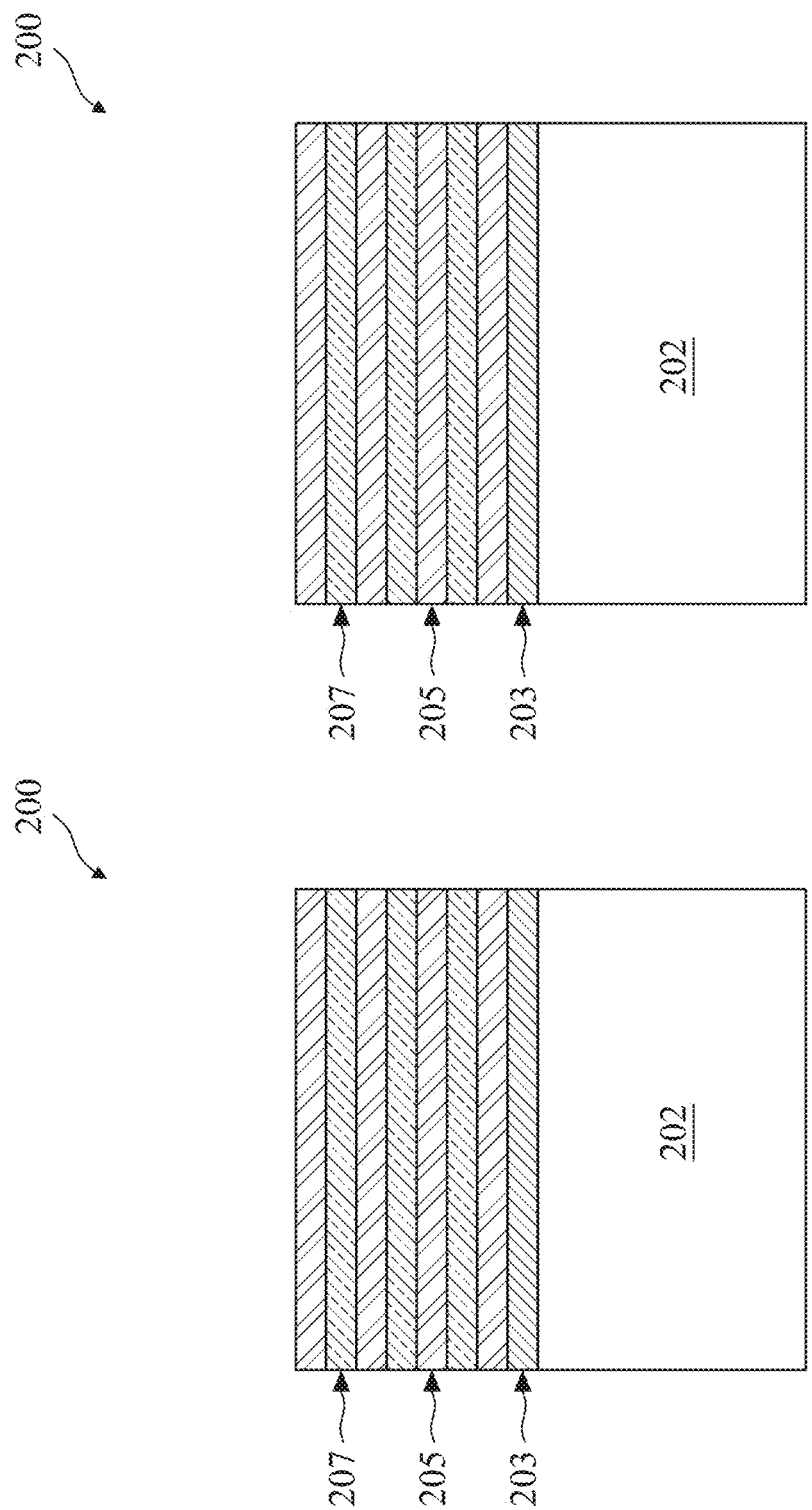

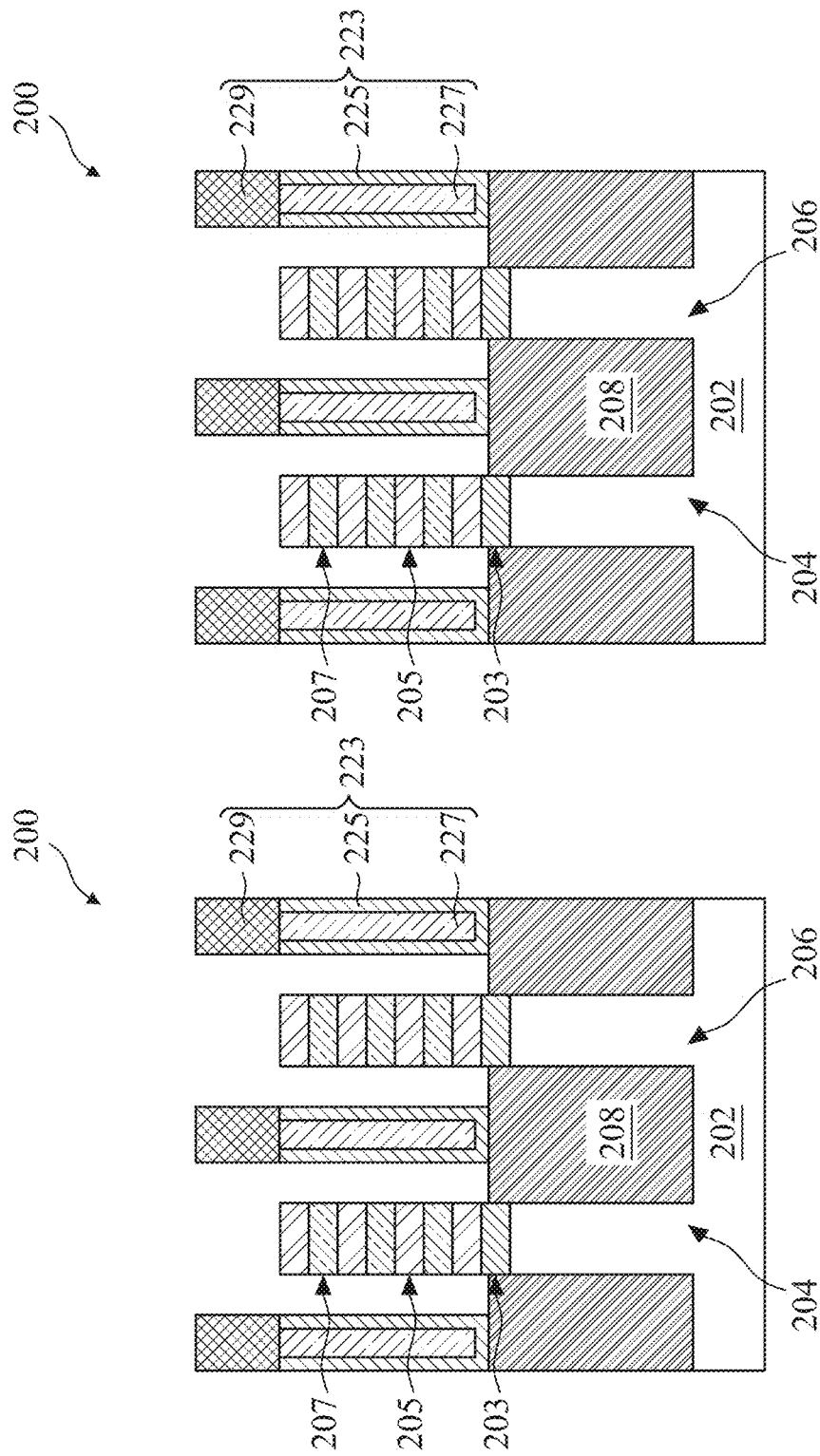

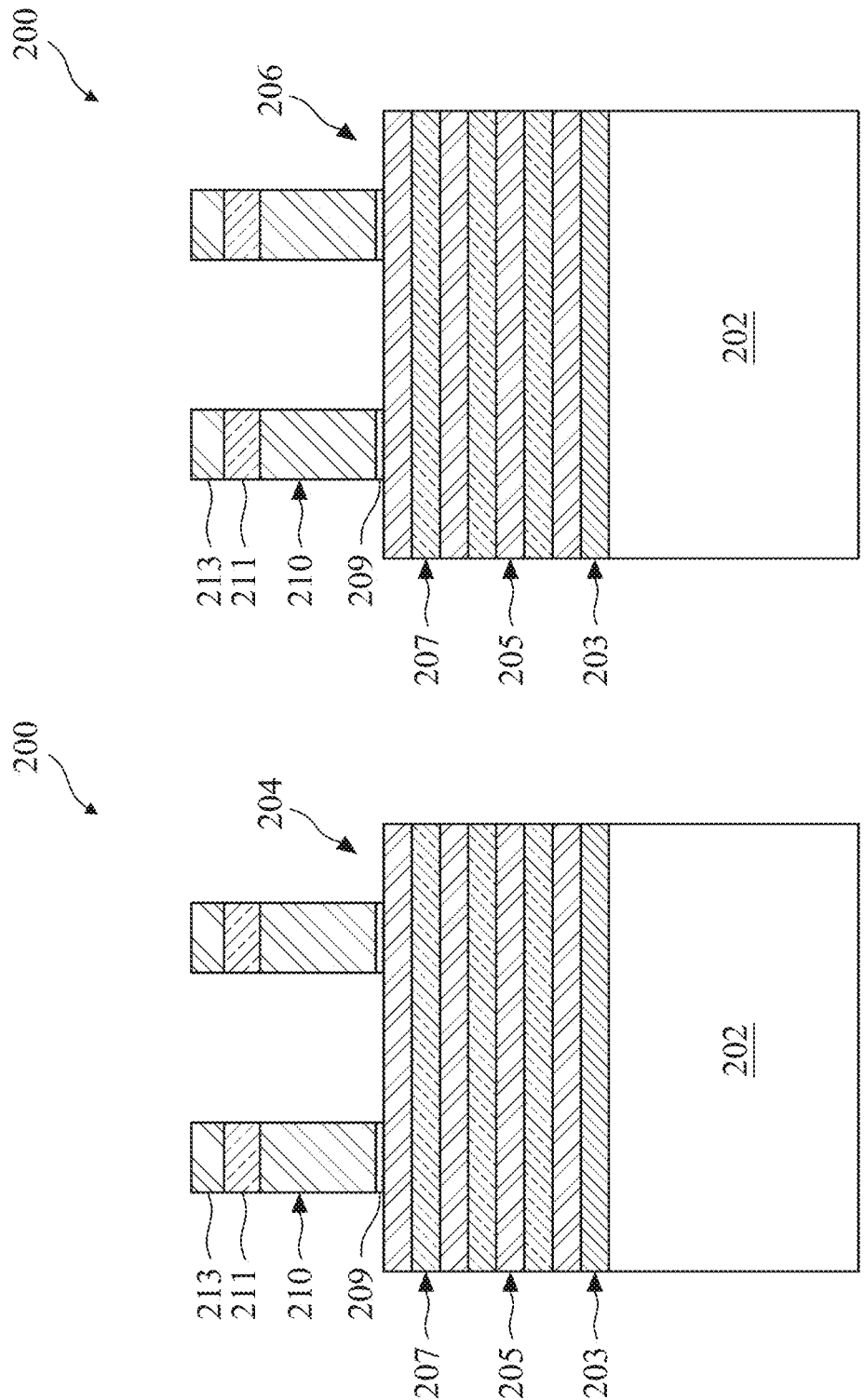

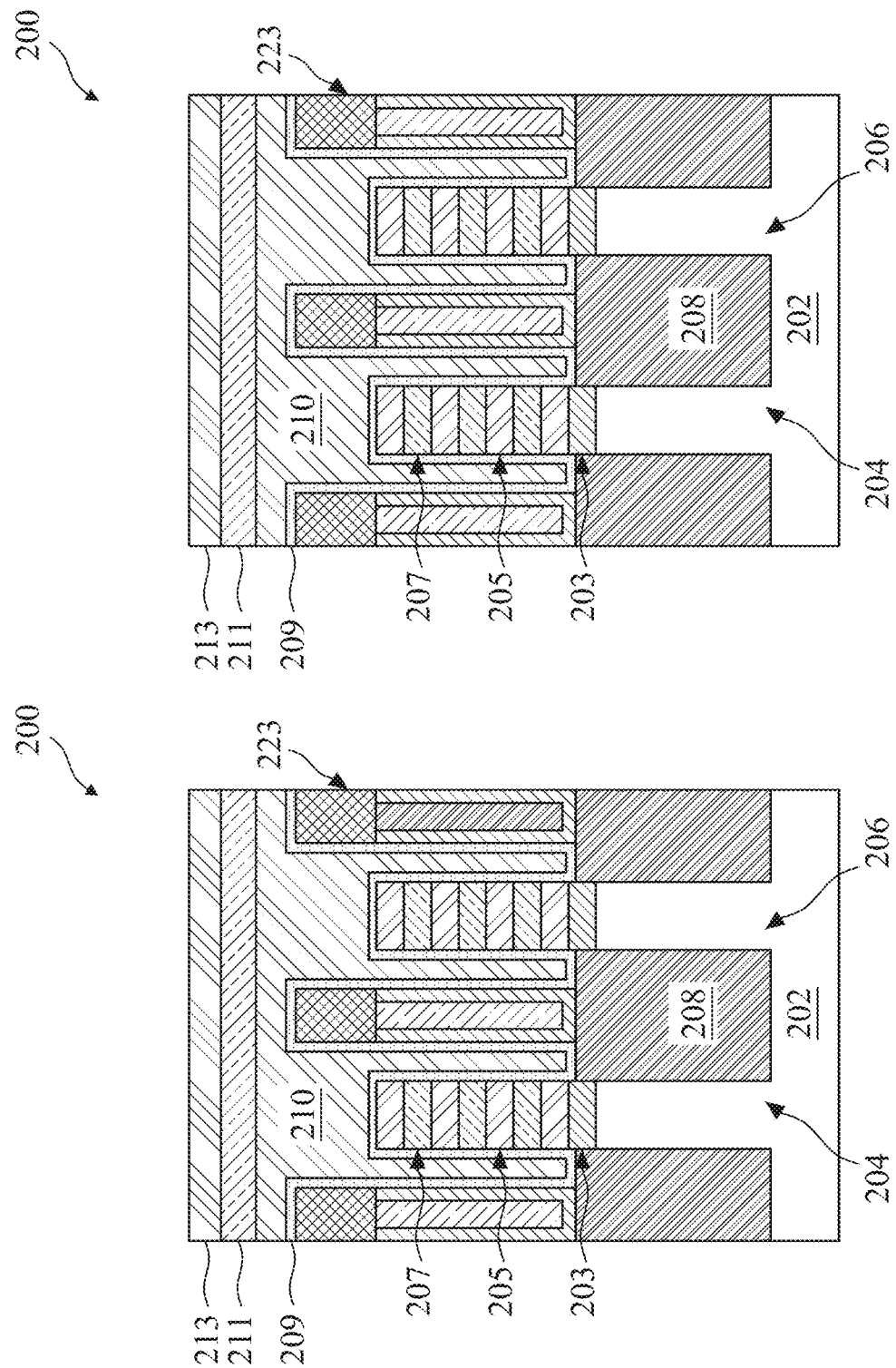

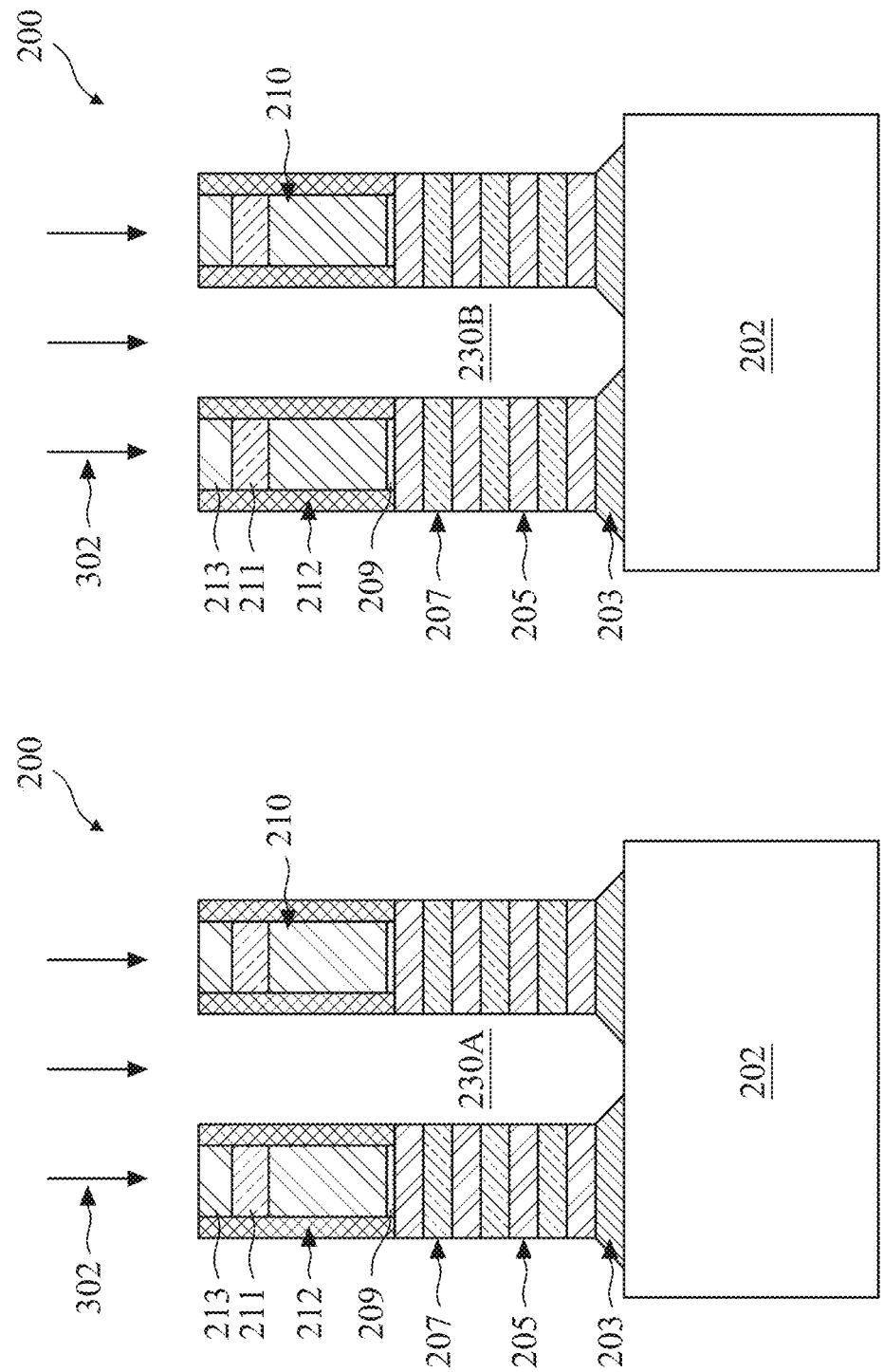

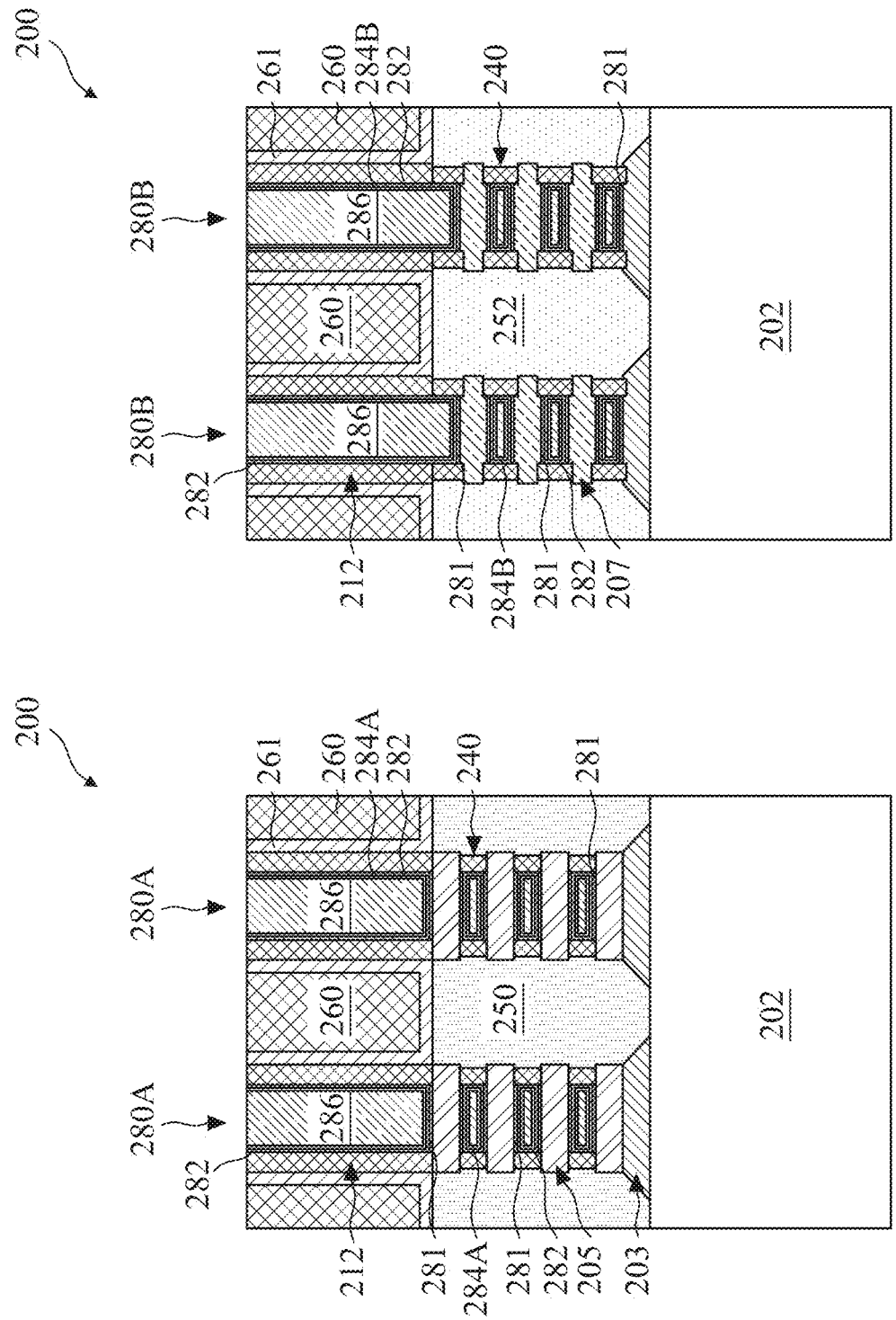

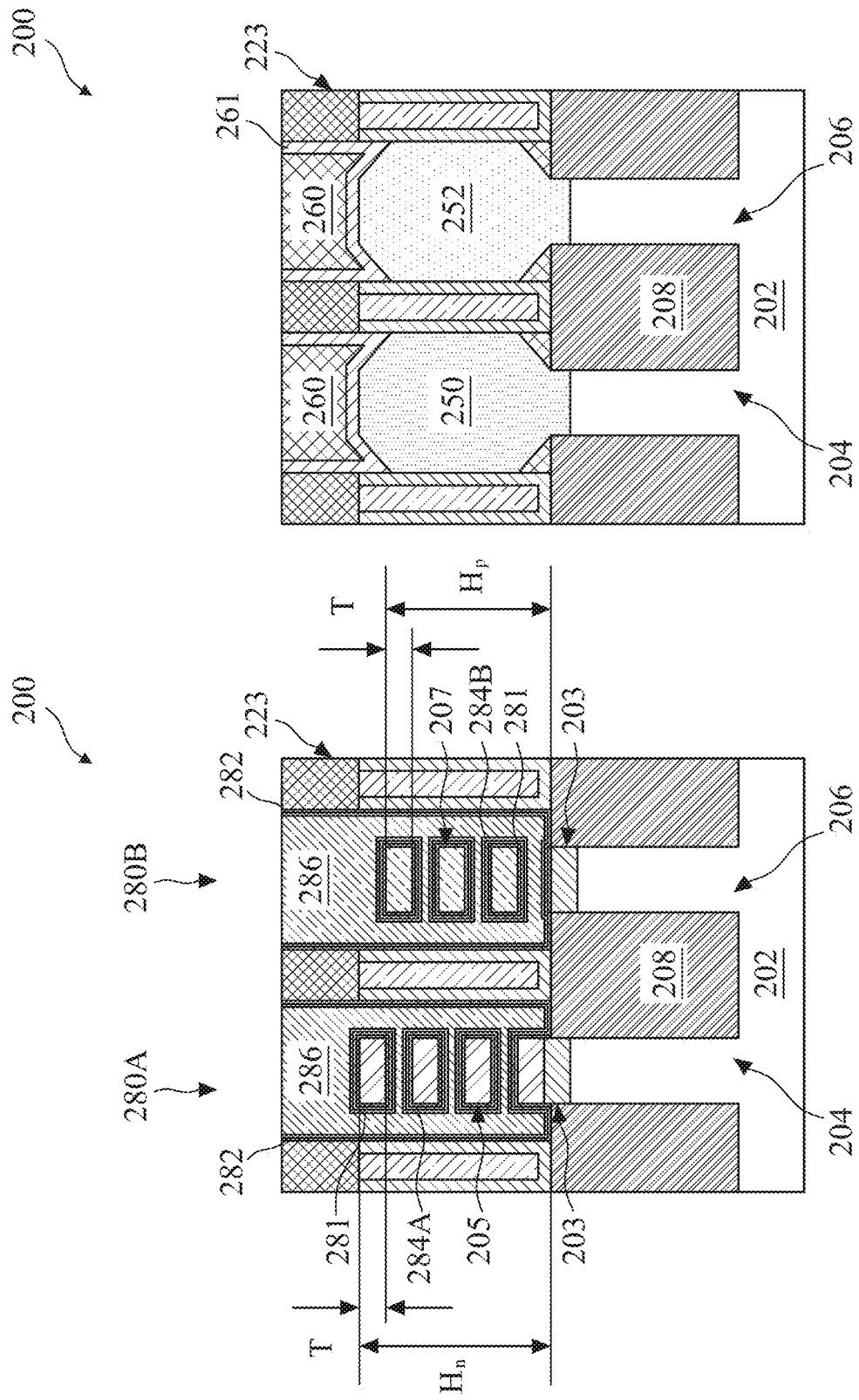

MULTI-LAYER CHANNEL STRUCTURES AND METHODS OF FABRICATING THE SAME IN FIELD-EFFECT TRANSISTORS

PRIORITY DATA

The present application is a continuation application of U.S. patent application Ser. No. 18/168,338, filed Feb. 13, 2023, which is a continuation application of U.S. patent application Ser. No. 17/155,775, filed on Jan. 22, 2021, which claims priority to U.S. Provisional Patent Application No. 63/015,133, filed on Apr. 24, 2020, each of which is incorporated herein by reference in its entirety.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

Multi-gate transistors, such as gate-all-around (GAA) field-effect transistors (FETs), have been incorporated into various memory and core devices to reduce IC chip footprint while maintaining reasonable processing margins. While methods of forming GAA FETs have generally been adequate, they have not been entirely satisfactory in all aspects. For example, the process of tuning threshold voltage of a metal gate structure involving deposition and patterning of different work function metal (WFM) layers has become challenging when the channel region of the GAA FET is configured with a plurality of nanoscopic features (e.g., nanosheets, nanorods, etc.) closely arranged in a vertical stack. Thus, for at least this reason, improvements in methods of forming metal gate structures with suitable threshold voltage in GAA FETs are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A, and 17A are cross-sectional views of the semiconductor device shown in FIGS. 2A and 2B taken along line AA' at intermediate stages of the example method of FIGS. 1A and 1B according to various embodiments of the present disclosure.

FIGS. 3B, 4B, 5B, 6B, 7B, 8B, 9B, 10B, 11B, 12B, 13B, 14B, 15B, 16B, and 17B are cross-sectional views of the semiconductor device shown in FIGS. 2A and 2B taken along line BB' at intermediate stages of the example method of FIGS. 1A and 1B according to various embodiments of the present disclosure.

FIGS. 3C, 4C, 5C, 6C, 7C, 8C, 9C, 10C, 11C, 12C, 13C, 14C, 15C, 16C, 17C, 17E, and 17F are cross-sectional views of the semiconductor device shown in FIGS. 2A and 2B taken along line CC' at intermediate stages of the example method of FIGS. 1A and 1B according to various embodiments of the present disclosure.

FIGS. 3D, 4D, 5D, 6D, 7D, 8D, 9D, 10D, 11D, 12D, 13D, 14D, 15D, 16D, and 17D are cross-sectional views of the semiconductor device shown in FIGS. 2A and 2B taken along line DD' at intermediate stages of the example method of FIGS. 1A and 1B according to various embodiments of the present disclosure.

DETAILED DESCRIPTION

Figure 1A:
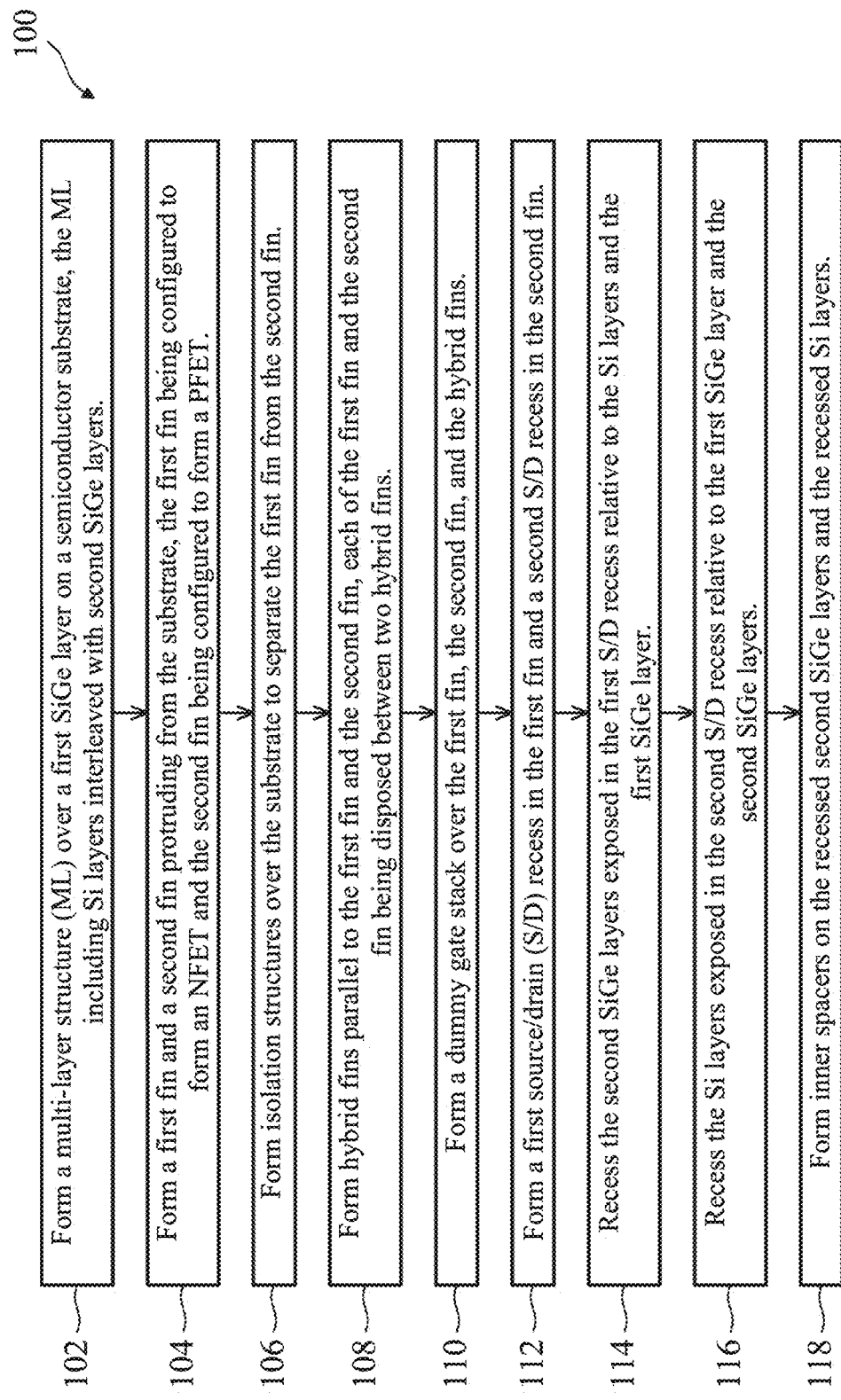
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally directed to structures of and methods of forming multi-gate metal-oxide-semiconductor field-effect transistors (MOSFETs or FETs in the present disclosure), such as gate-all-around (GAA) FETs. More specifically, the present disclosure is directed to structures of and methods of forming multi-layer channel regions in n-channel or n-type GAA FETs (GAA NFETs) and p-channel or p-type GAA FETs (GAA PFETs) that together form a complementary MOSFET (CMOSFET). The GAA FETs provided herein may be nanosheet-based FETs, nanowire-based FETs, and/or nanorod-based FETs. In other words, the present disclosure does not limit the GAA FETs to have a specific configuration.

Generally, the channel region of a GAA NFET and the channel region of a GAA PFET each include a stack of silicon-based channel layers (Si layers) interleaved between a metal gate structure. While such structures are generally adequate for maintaining performance of the GAA devices, they are not entirely satisfactory in all aspects. For example, because an NFET and a PFET are generally configured with different work function (WF) in their respective gate structure in order to achieve a specific threshold voltage ($V_t$) requirement in the CMOSFET, different work function metal (WFM) layer(s) are included as a part of the devices' respective metal gate structure. However, the fabrication of the WFM layers may include a series of deposition and patterning processes, which become complex at reduced length scales in the multi-layered structure of a GAA FET. The present embodiments provide methods of forming a GAA CMOSFET in which the channel region of the NFET and the channel region of the PFET are configured with different materials (Si layers and SiGe layers, respectively), allowing the $V_t$ of the NFET and the PFET be tuned with WFM layer(s) of the same compositions, thereby reducing processing complexity associated with fabricating multiple WFMs.

Figure 1B:
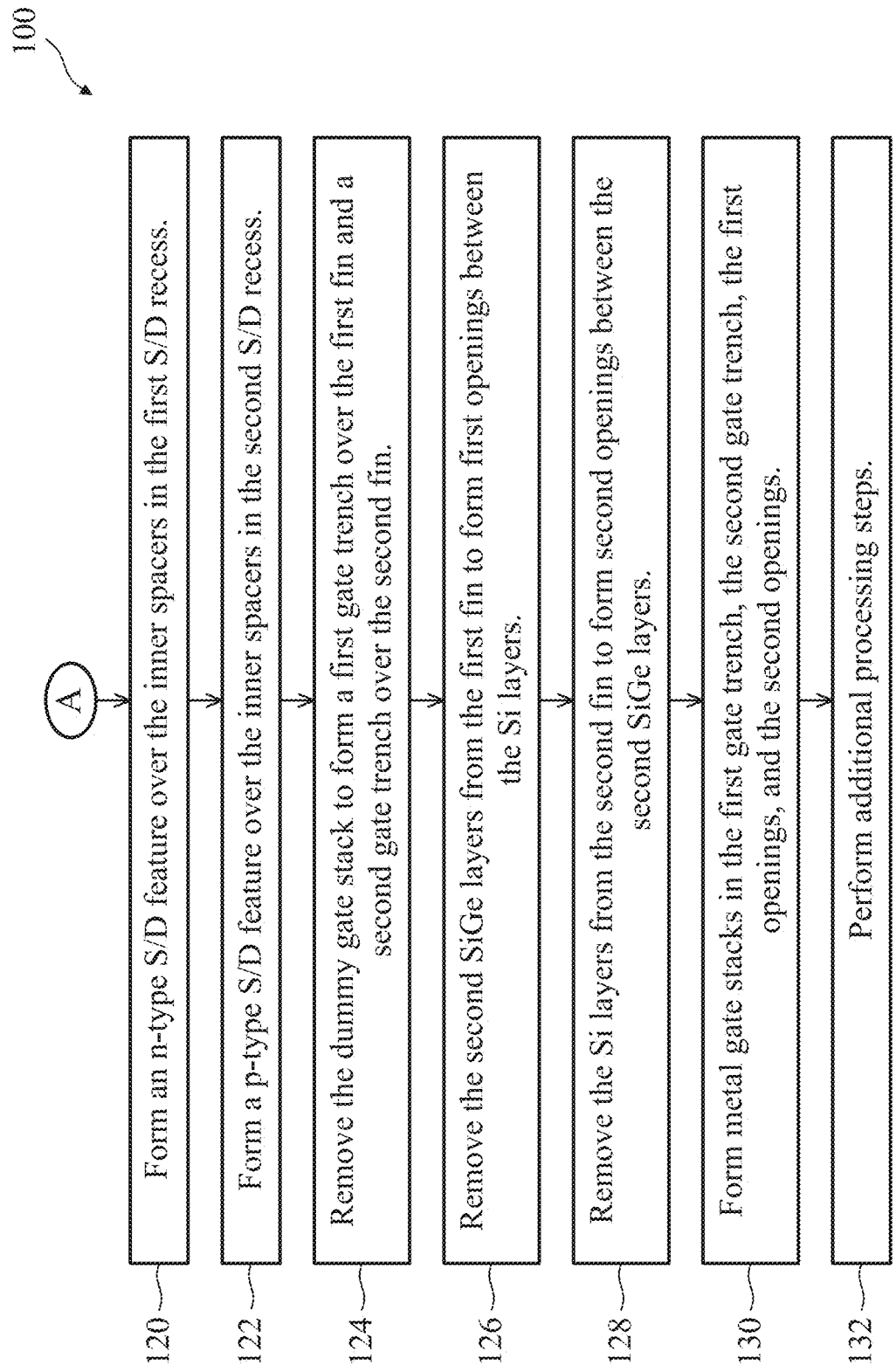
Figure 2A:
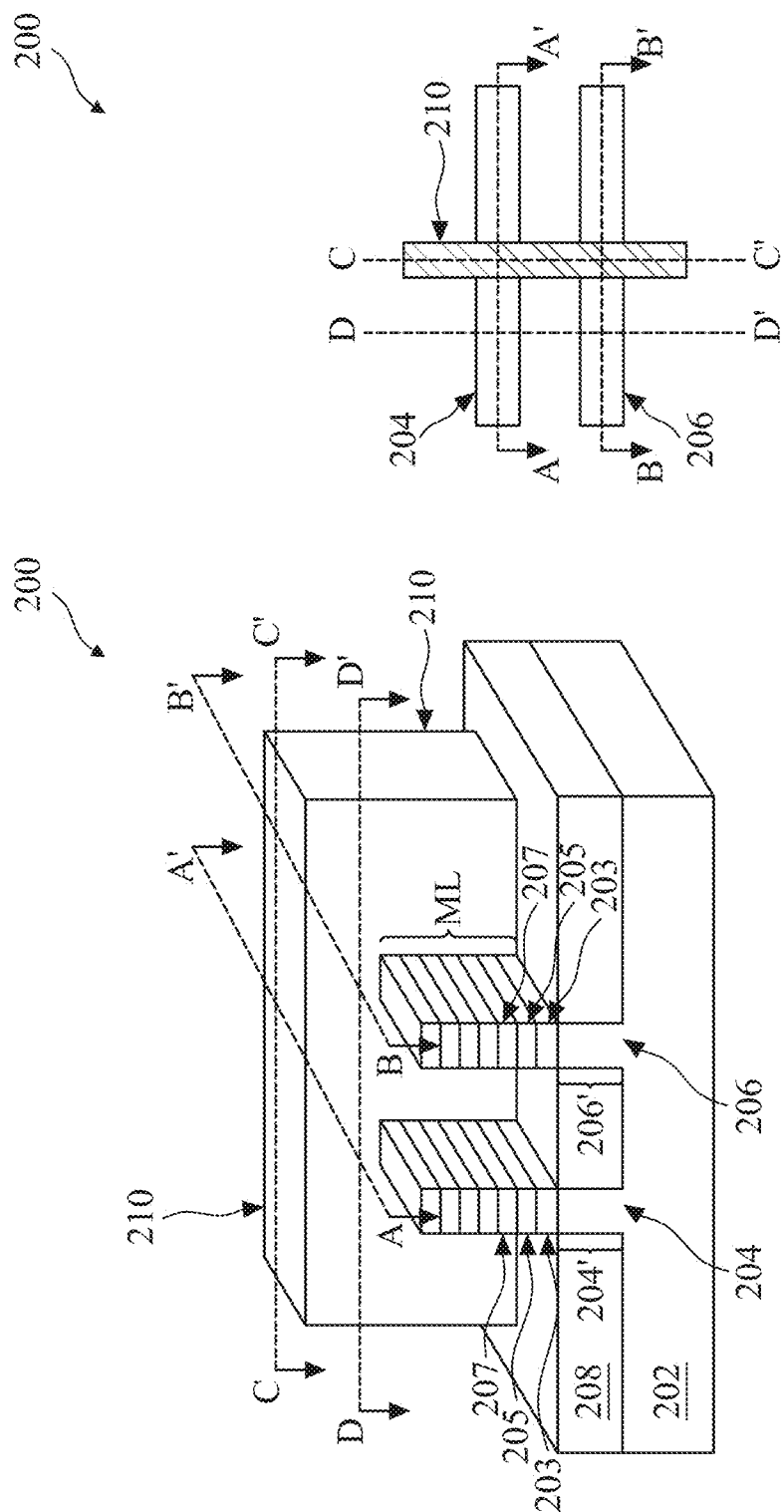
FIG. 2A is a three-dimensional perspective view of an example semiconductor device according to various embodiments of the present disclosure.
Figure 2B:
FIG. 2B is a planar top view of the semiconductor device shown in FIG. 2A according to various embodiments of the present disclosure.
Figures 17E, 17F:
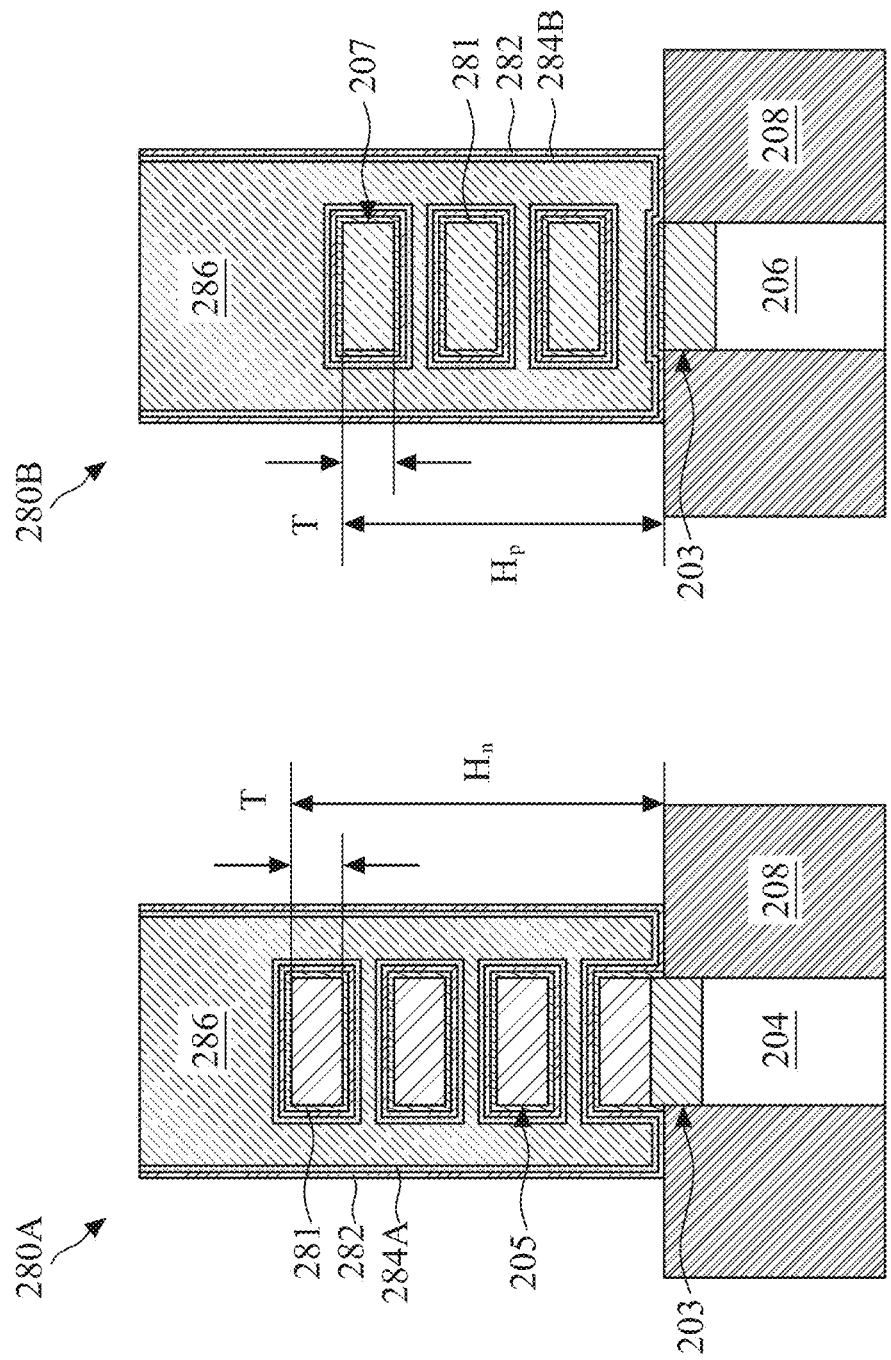
Figure 18:
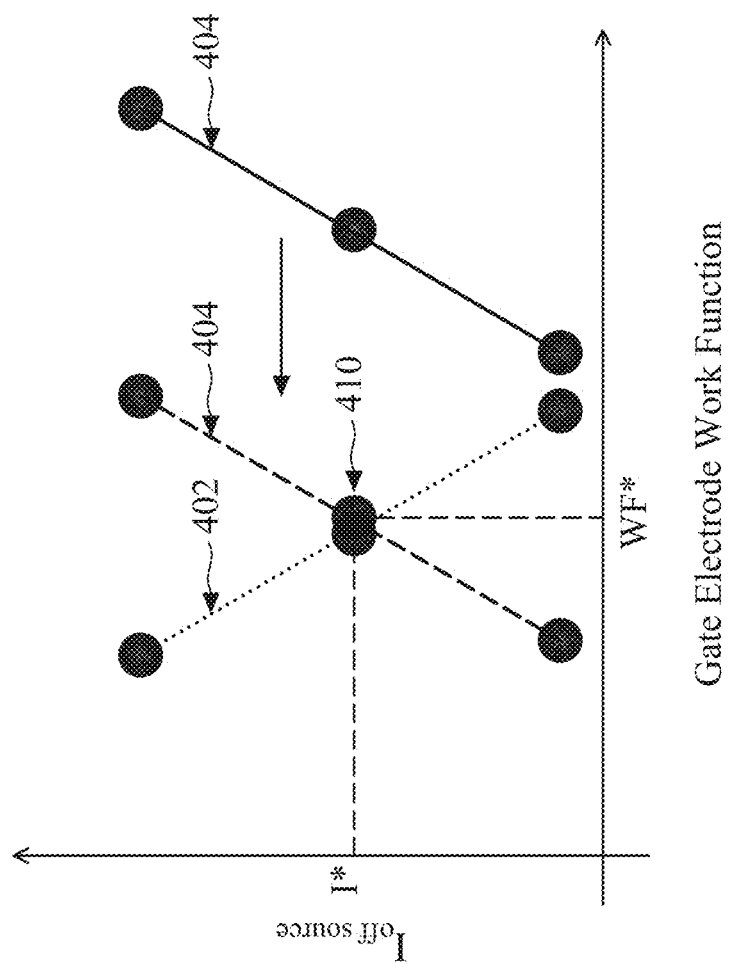
FIG. 18 is a schematic illustration of a relationship between current and work function of an embodiment of the semiconductor device according to various embodiments of the present disclosure.

Referring now to FIGS. 1A and 1B, flowchart of method 100 of forming a semiconductor device (hereafter referred to as the device) 200 are illustrated according to various aspects of the present disclosure. Method 100 is merely an example and is not intended to limit the present disclosure beyond what is explicitly recited in the claims. Additional operations can be provided before, during, and after methods 100 and 300, and some operations described can be replaced, eliminated, or moved around for additional embodiments of the method. Method 100 is described below in conjunction with FIGS. 2A-18, where FIG. 2A is a three-dimensional perspective view, FIG. 2B is a planar top view, and FIGS. 3A-17D are cross-sectional views taken through various regions of the device 200 as depicted in FIGS. 2A and 2B at intermediate steps of method 100. Specifically, FIGS. 3A, 4A, 5A, 6A, 7A, 8A, 9A, 10A, 11A, 12A, 13A, 14A, 15A, 16A, and 17A are cross-sectional views along line AA' taken through a fin active region (hereafter referred to as the fin) 204 of the device 200, FIGS. 3B, 4B, 5B, 6B, 7B, 8B, 9B, 10B, 11B, 12B, 13B, 14B, 15B, 16B, and 17B are cross-sectional views along line BB' taken through a fin 206 of the device 200, FIGS. 3C, 4C, 5C, 6C, 7C, 8C, 9C, 10C, 11C, 12C, 13C, 14C, 15C, 16C, 17C, 17E, and 17F are cross-sectional views along line CC' taken through channel regions of the fin 204 and the fin 206, FIGS. 3D, 4D, 5D, 6D, 7D, 8D, 9D, 10D, 11D, 12D, 13D, 14D, 15D, 16D, and 17D are cross-sectional views along line DD' taken through source/drain (S/D) regions of the fin 204 and the fin 206, and FIG. 18 is a schematic illustration of a relationship between current and work function in an embodiment of a GAA FET provided herein.

The device 200 may be an intermediate device fabricated during processing of an IC, or a portion thereof, that may comprise static random-access memory (SRAM) and/or other logic circuits, passive components such as resistors, capacitors, and inductors, and active components such as GAA FETs, FinFETs, MOSFETs, CMOSFETs, bipolar transistors, high voltage transistors, high frequency transistors, and/or other transistors. The present disclosure is not limited to any particular number of devices or device regions, or to any particular device configurations. Additional features can be added to the device 200, and some of the features described below can be replaced, modified, or eliminated in other embodiments of the device 200.

Referring to FIGS. 2A and 3A-3D, method 100 at operation 102 provides a semiconductor substrate (hereafter referred to as "the substrate") 202 and subsequently forms a multi-layered structure (ML) thereover. The substrate 202 may include an elemental (i.e., having a single element) semiconductor, such as silicon (Si), germanium (Ge), or other suitable materials; a compound semiconductor, such as silicon carbide, gallium arsenic, gallium phosphide, indium phosphide, indium arsenide, indium antimonide, other suitable materials, or combinations thereof; an alloy semiconductor, such as SiGe, GaAsP, AlInAs, AlGaAs, GaInAs, GaInP, GaInAsP, other suitable materials, or combinations thereof. The substrate 202 may be a single-layer material having a uniform composition. Alternatively, the substrate 202 may include multiple material layers having similar or different compositions suitable for manufacturing the device 200.

In some examples where the substrate 202 includes FETs, various doped regions may be disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques. Of course, these examples are for illustrative purposes only and are not intended to be limiting.

In the present embodiments, the ML includes alternating silicon germanium (SiGe) and silicon (Si) layers arranged in a vertical stack along the Z axis and is configured to provide channel regions suitable for forming at least one GAA NFET and at least one GAA PFET. In the depicted embodiments, the bottommost layer of the ML is a SiGe layer 203 and the subsequent layers of the ML include alternating Si layers 205 and SiGe layers 207, where the SiGe layers 207 are configured as the channel layers for the GAA PFET as discussed in detail below. In the present embodiments, the ML includes the same number of the Si layers 205 as the number of the SiGe layer 203 and the SiGe layers 207 combined. In other words, the number of the SiGe layers 207 is one less than the number of the Si layers 205. In some examples, the ML may include three to ten Si layers 205 and, accordingly, two to nine SiGe layers 207.

In the present embodiments, each Si layer 205 includes elemental Si and is substantially free of Ge, while the SiGe layer 203 and each SiGe layer 207 substantially include both Si and Ge, though the amount of Ge in the SiGe layer 203 is less than that in the SiGe layer 207. In some embodiments, the amount of Ge in the SiGe layer 207 is about 20% to about 50%, and the amount of Ge in the SiGe layer 203 is at least about 10% but less than about 20%. Accordingly, in the present embodiments, the amount of Si in the SiGe layer 207 is about 50% to about 80%, and the amount of Si in the SiGe layer 203 is at least about 80% but less than about 90%. By comparison, the amount of Si in each Si layer 205 is at least about 90%.

In the present embodiments, Ge at the minimum composition of about 20% increases hole mobility of SiGe in the SiGe layers 207 relative to the Si layers 205, thereby lowering the WF of the subsequently formed metal gate structure (i.e., the high-k metal gate structure 280B depicted in FIGS. 17B, 17C, and 18) needed to tune the $V_t$ of the PFET to be compatible with that of the NFET. A composition of less than about 20% may not be sufficient to bring about such shift in WF needed for tuning the $V_t$. With respect to the SiGe layer 203, on one hand, Ge at the minimum composition of about 10% ensures sufficient etching selectivity between the Si layers 205 and the SiGe layer 203, such that the SiGe layer 203 may not, or not completely, be etched when removing the Si layers 205 (i.e., the non-channel layers) to form openings between the SiGe layers 207 (i.e., the channel layers) of the PFET. On the other hand, Ge not exceeding about 20% in the SiGe layer 203 (i.e., less than the minimum composition of Ge in the SiGe layers 207) ensures sufficient etching selectivity between the SiGe layer 203 and the SiGe layers 207, such that the SiGe layer 203 may not, or not substantially, be etched when removing the SiGe layers 207 (i.e., the non-channel layers) to form openings between the Si layers 205 (i.e., the channel layers) of the NFET. In other words, the SiGe layer 203 is configured as a stopping layer to protect the substrate 202 from being inadvertently damaged during multiple subsequent fabrication processes.

Along a similar line of reasoning, Ge at the minimum composition of about 20% in the SiGe layers 207 ensures sufficient etching selectivity with respect to the SiGe layer 203. On the other hand, Ge exceeding about 50% in the SiGe layers 207 (i.e., the channel layers of the PFET) may cause defects in subsequently-formed epitaxial S/D features, exacerbate issues related to leakage current, and/or lead to worse drain-induced barrier lowering (DIBL) effects due to reduced bandgap.

In the present embodiments, forming the ML includes alternatingly growing a SiGe layer (i.e., the SiGe layer 203 or the SiGe layer 207) and a Si layer (i.e., the Si layer 205) in a series of epitaxy growth processes implementing chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use a gaseous and/or liquid precursor that interacts with the composition of the underlying substrate. For example, the substrate 202, which includes Si, may interact with a Ge-containing precursor to form the SiGe layer 203. In some examples, the SiGe layer 203, the Si layers 205, and the SiGe layers 207 may be formed into nanosheets, nanowires, or nanorods. In the present embodiments, the SiGe layer 203, the Si layers 205, and the SiGe layers 207 are each formed to substantially the same thickness T measured along the Z axis as depicted in FIG. 3A.

In the present embodiments, the Si layers 205 are configured as channel layers for forming the NFET, while the SiGe layer 203 and the SiGe layers 207 are configured as the channel layers for forming the PFET. Accordingly, the SiGe layers 207 disposed between the Si layers 205 of the NFET are configured as the non-channel layers of the NFET and the Si layers 205 disposed between the SiGe layers 207 are configured as the non-channel layers of the PFET. A sheet (or wire) release process may then be implemented to form multiple openings between the corresponding channel layers, and a metal gate structure is subsequently formed in the openings to complete fabrication of the respective FETs. Notably, as discussed herein, due to their differences in composition, the SiGe layers 207 are selectively removed with respect to the SiGe layer 203 during the subsequent sheet formation (or sheet release) process for forming the PFET.

Now referring to FIGS. 2A, 2B, and 4A-4D, method 100 at operation 104 forms the fin 204 and the fin 206 over the substrate 202. In the depicted embodiments, the fins 204 and 206 are disposed adjacent and substantially parallel to each other, i.e., both oriented lengthwise along the X axis and spaced along the Y axis. As discussed in detail below, while the fins 204 and 206 are fabricated from the same ML and the substrate 202, they are, however, configured to provide GAA FETs of different conductivity type, i.e., one of the fins 204 and 206 is configured to provide an NFET and the other one of the fins 204 and 206 is configured to provide a PFET. In the depicted embodiments, the fin 204 is configured to provide an NFET and the fin 206 is configured to provide a PFET. Accordingly, the fin 204 may be formed in a region of the substrate 202 doped with a p-type dopant (i.e., a p-well structure) and the fin 206 may be formed in a region of the substrate 202 doped with an n-type dopant (i.e., an n-well structure). It is noted that embodiments of the device 200 may include additional fins (semiconductor fins) disposed over the substrate 202 configured to provide one or more NFETs and/or PFETs.

In the present embodiments, still referring to FIGS. 2A, 2B, and 4A-4D, each fin 204 includes the ML disposed over a base fin 204' and each fin 206 includes the ML disposed over a base fin 206', where the base fins 204' and 206' protrude from the substrate 202. The fins 204 and 206 may be fabricated using suitable processes including photolithography and etch processes. The photolithography process may include forming a masking element having a hard mask layer 220 over the ML, a hard mask layer 222 over the hard mask layer 220, a photoresist layer (resist; not depicted) over the hard mask layer 222, exposing the resist to a pattern, performing a post-exposure bake process to the resist, and developing the resist to form a patterned masking element exposing portions of the ML. The patterned masking element is then used for etching recesses into the ML and portions of the substrate 202, leaving the fins 204 and 206 protruding from the substrate 202. The hard mask layers 220 and 222 have different compositions and may each include silicon oxide, silicon nitride, silicon carbide, silicon oxynitride, silicon oxycarbide, other suitable materials, or combinations thereof. The etching process may include dry etching, wet etching, reactive ion etching (RIE), other suitable processes, or combinations thereof.

Numerous other embodiments of methods for forming the fins 204 and 206 may be suitable. For example, the fins 204 and 206 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204 and 206.

Referring to FIGS. 2A and 5A-5D, method 100 at operation 106 forms isolation structures 208 over the substrate 202 and separating bottom portions of the fins 204 and 206. The isolation structures 208 may include silicon oxide, fluoride-doped silicate glass (FSG), a low-k dielectric material, other suitable materials, or combinations thereof. In the present embodiments, the isolation structures 208 include shallow trench isolation (STI) features. In some embodiments, the isolation structures 208 are formed by depositing a dielectric layer over the substrate 202, thereby filling trenches between the fins 204 and 206, and subsequently recessing the dielectric layer such that a top surface of the isolation structures 208 is below a top surface of the fins 204 and 206, as depicted in FIGS. 5C and 5D. Other isolation structures such as field oxide, local oxidation of silicon (LOCOS), other suitable structures, or combinations thereof may also be implemented as the isolation structures 208. In some embodiments, the isolation structures 208 may include a multi-layer structure, for example, having one or more thermal oxide liner layers. The isolation structures 208 may be deposited by any suitable method, such as CVD, flowable CVD (FCVD), spin-on-glass (SOG), other suitable methods, or combinations thereof.

Referring to FIGS. 6A-6D, method 100 at operation 108 forms dielectric fins 223 over the isolation structures 208, such that each of the fins 204 and 206 is disposed between two dielectric fins 223. Each dielectric fin 223 may be a single-layer structure or a multi-layer structure. In the present embodiments, the dielectric fin 223 is a tri-layer structure that includes a first layer 225 disposed on the isolation structures 208, a second layer 227 enclosed by the first layer 225, and a third layer 229 disposed over the first layer 225 and the second layer 227. The first layer 225, the second layer 227, and the third layer 229 may each include one or more dielectric material, such as silicon oxide, silicon nitride, silicon carbide, silicon oxynitride, silicon oxycarbide, other suitable materials, or combinations thereof. In some embodiments, the first layer 225, the second layer 227, and the third layer 229 differ in composition. The dielectric fins 223 may be formed by any suitable process, including depositing and planarizing the first layer 225 over the device 200 to fill the space surrounding the fins 204 and 206, patterning (e.g., by a photolithography method) the first layer 225 to form trenches between the fins 204 and 206, depositing and planarizing the second layer 227 in the trenches, depositing the third layer 229 over the first layer 225 and the second layer 227, patterning the third layer 229 to expose portions of the first layer 225, and removing the exposed portions of the first layer 225 using the patterned third layer 229 as a hard mask. The first layer 225, the second layer 227, and the third layer 229 may be formed by any suitable deposition process, such as CVD, FCVD, ALD, other suitable processes, or combinations thereof. In the present embodiments, the dielectric fins 223 are configured to control the subsequent formation of n-type and p-type epitaxial S/D features over the fin 204 and the fin 206, respectively. In some examples, the dielectric fins 223 may prevent over-growth of epitaxial S/D features that inadvertently causes shorting in the device 200.

Now referring to FIGS. 2A, 2B, and 7A-7D, method 100 at operation 110 forms a dummy gate stack (i.e., a placeholder gate) 210 over the channel region of each of the fins 204 and 206. In the present embodiments, portions of the dummy gate stack 210, which includes polysilicon, are replaced with a high-k (referring to a dielectric material having a dielectric constant greater than that of silicon oxide, which is about 3.9) metal gate structure (HKMG) after forming other components of the device 200. The dummy gate stack 210 may be formed by a series of deposition and patterning processes. For example, the dummy gate stack 210 may be formed by depositing a polysilicon layer over the fins 204 and 206, and subsequently performing an anisotropic etching process (e.g., a dry etching process) to leave portions of the polysilicon over the channel regions of the fins 204 and 206. In the present embodiments, the device 200 further includes an interfacial layer 209, which is formed on the fins 204 and 206 before depositing the dummy gate stack 210 by a suitable method, such as thermal oxidation, chemical oxidation, other suitable methods, or combinations thereof. In the depicted embodiments, a hard mask layer 211 and a hard mask layer 213 are formed over the dummy gate stack 210 to protect the dummy gate stack 210 from being etched during subsequently operations. The hard mask layers 211 and 213 may each include any suitable dielectric material discussed above with respect to the hard mask layers 220 and 222, and may be formed by a suitable deposition process, such as CVD, ALD, PVD, other suitable processes, or combinations thereof. The hard mask layers 211 and 213 are later removed before removing the dummy gate stack 210 to form the HKMG.

Figure 8D:
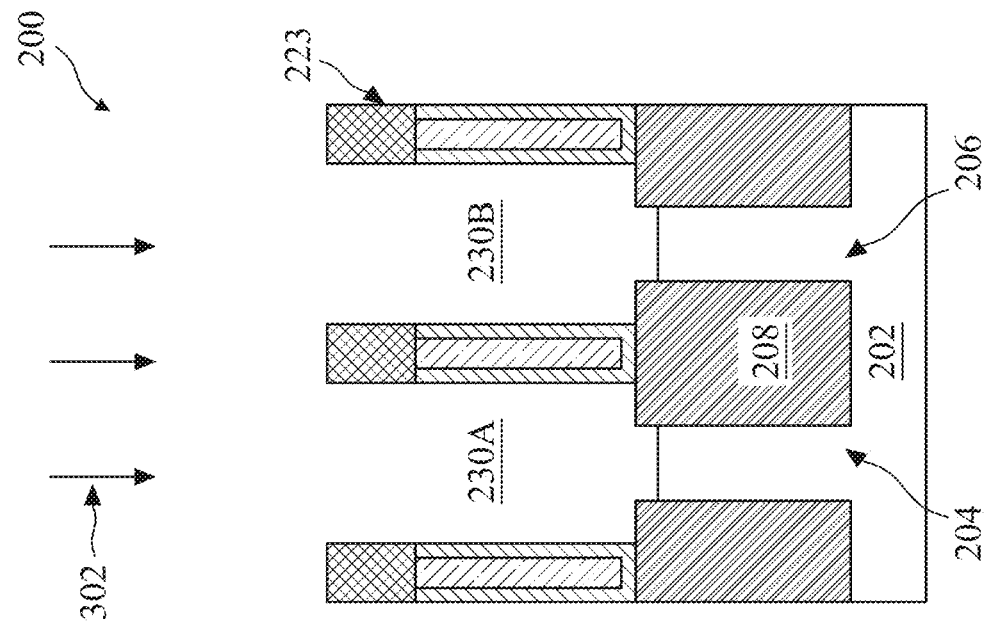
Figure 8C:
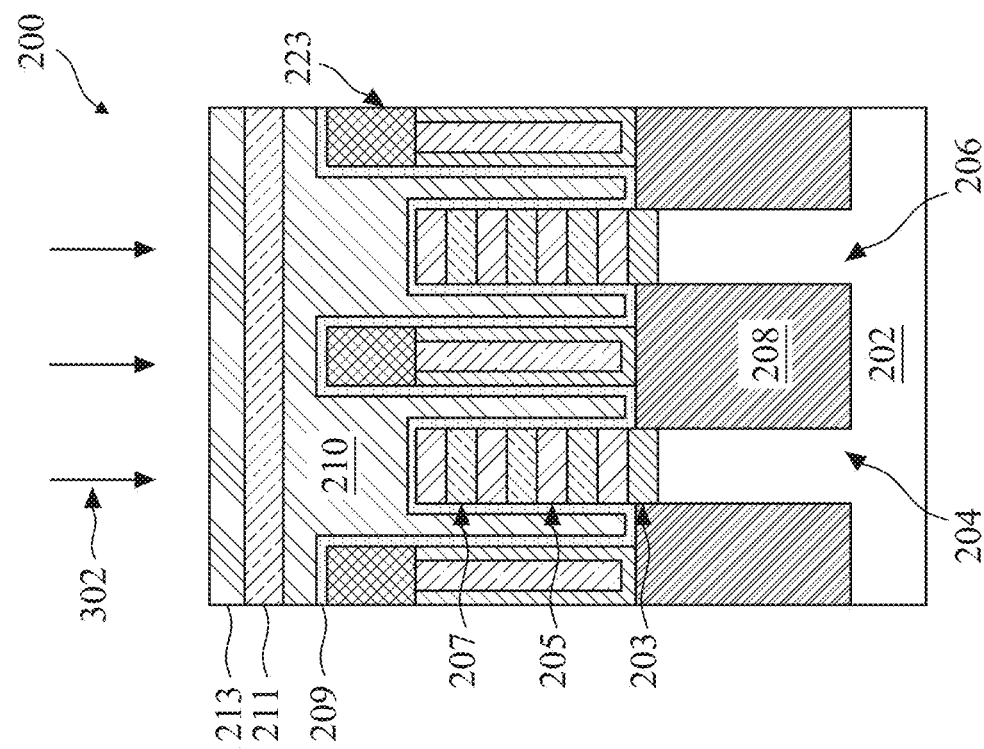
Figures 9A, 9B:
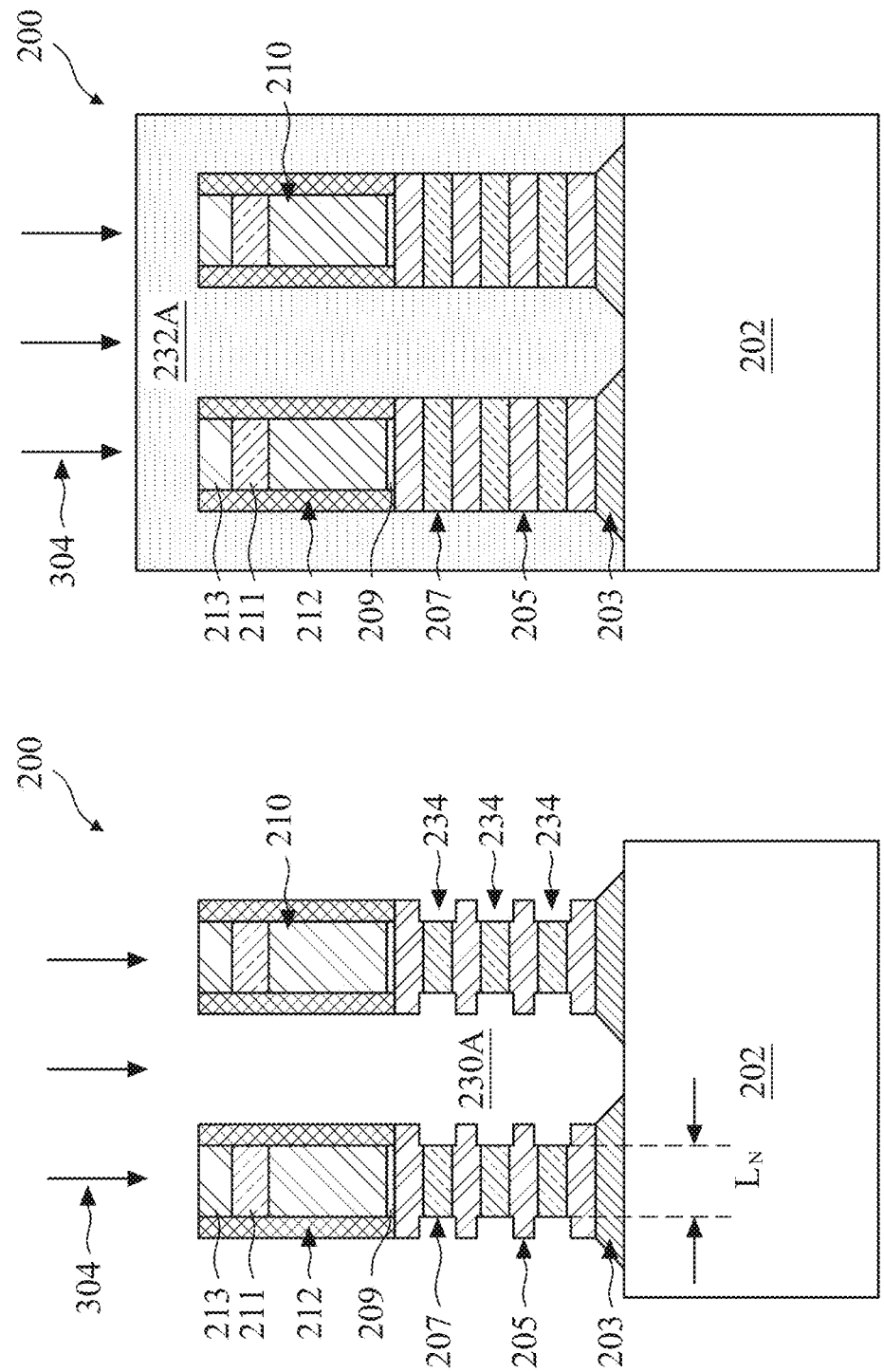
Figure 9D:
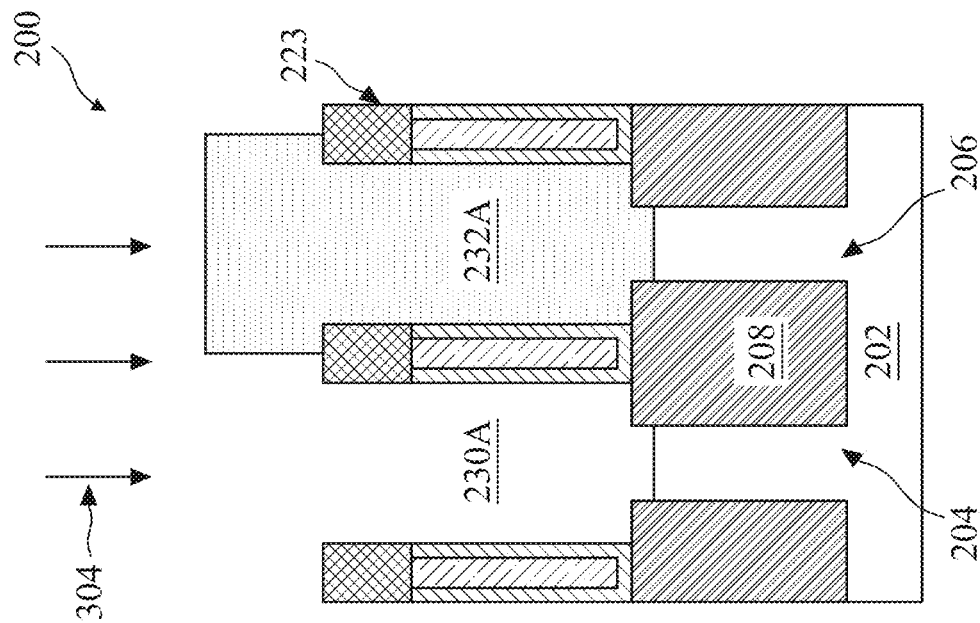
Figure 9C:
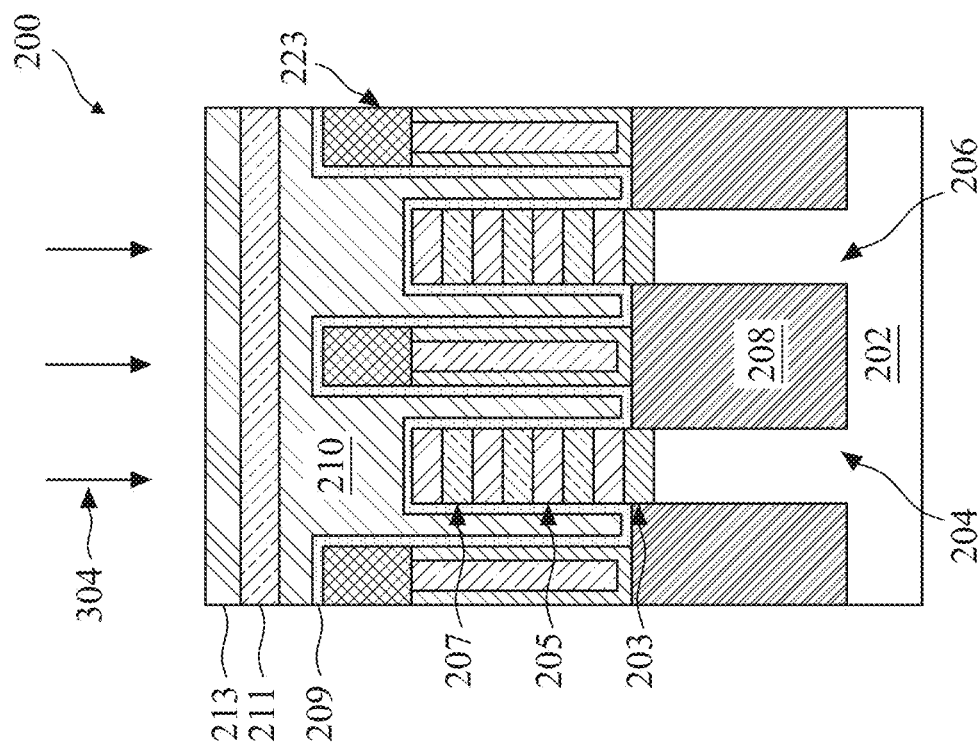
Figures 10A, 10B:
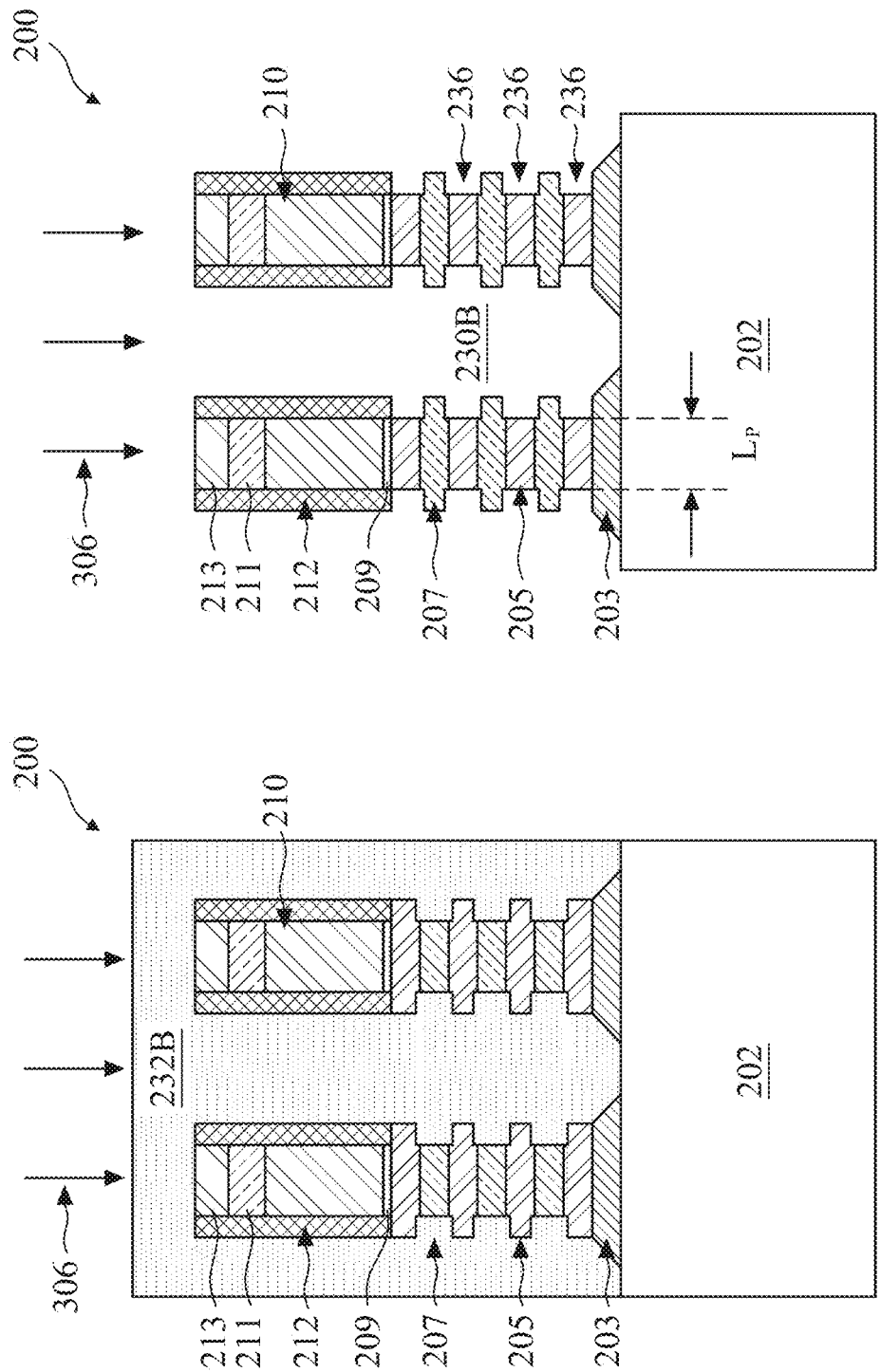
Figure 10C:
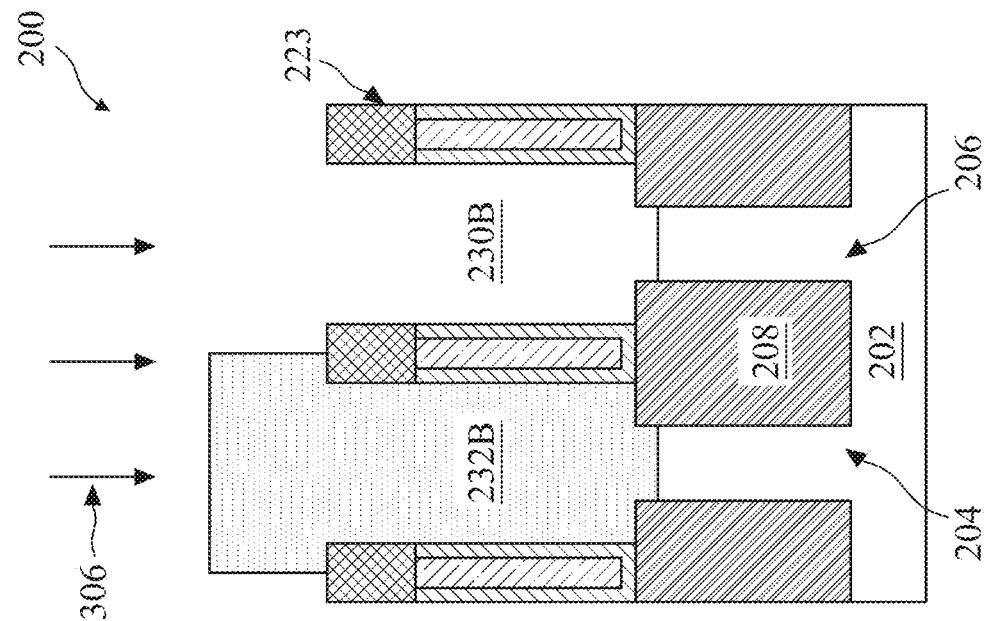
Figure 10D:
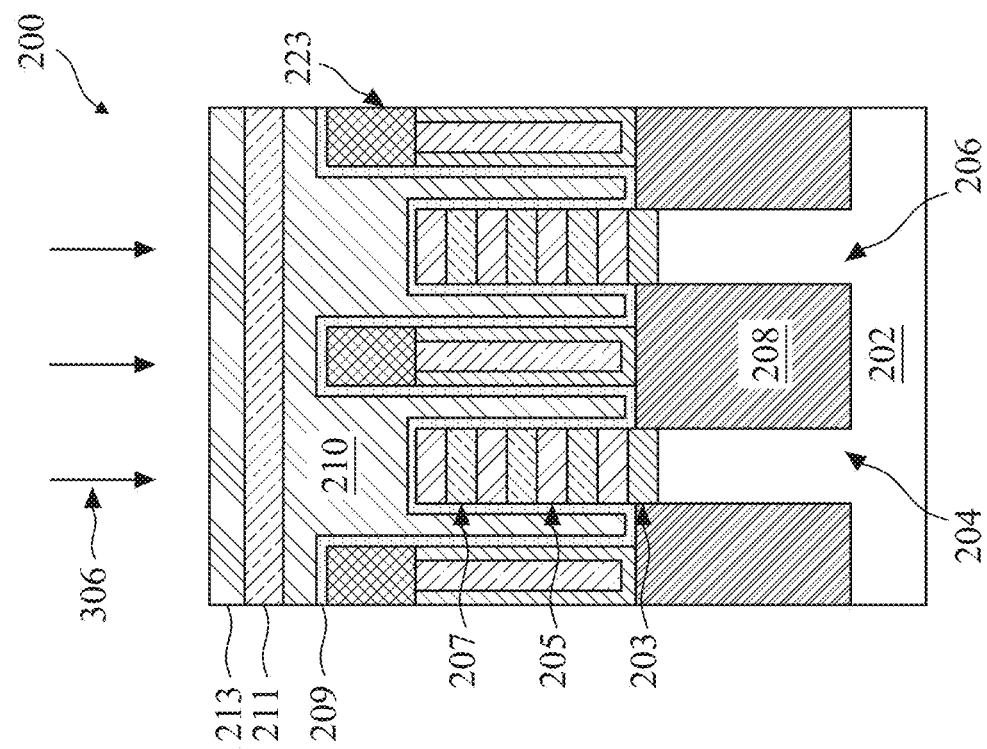
Figures 11A, 11B:
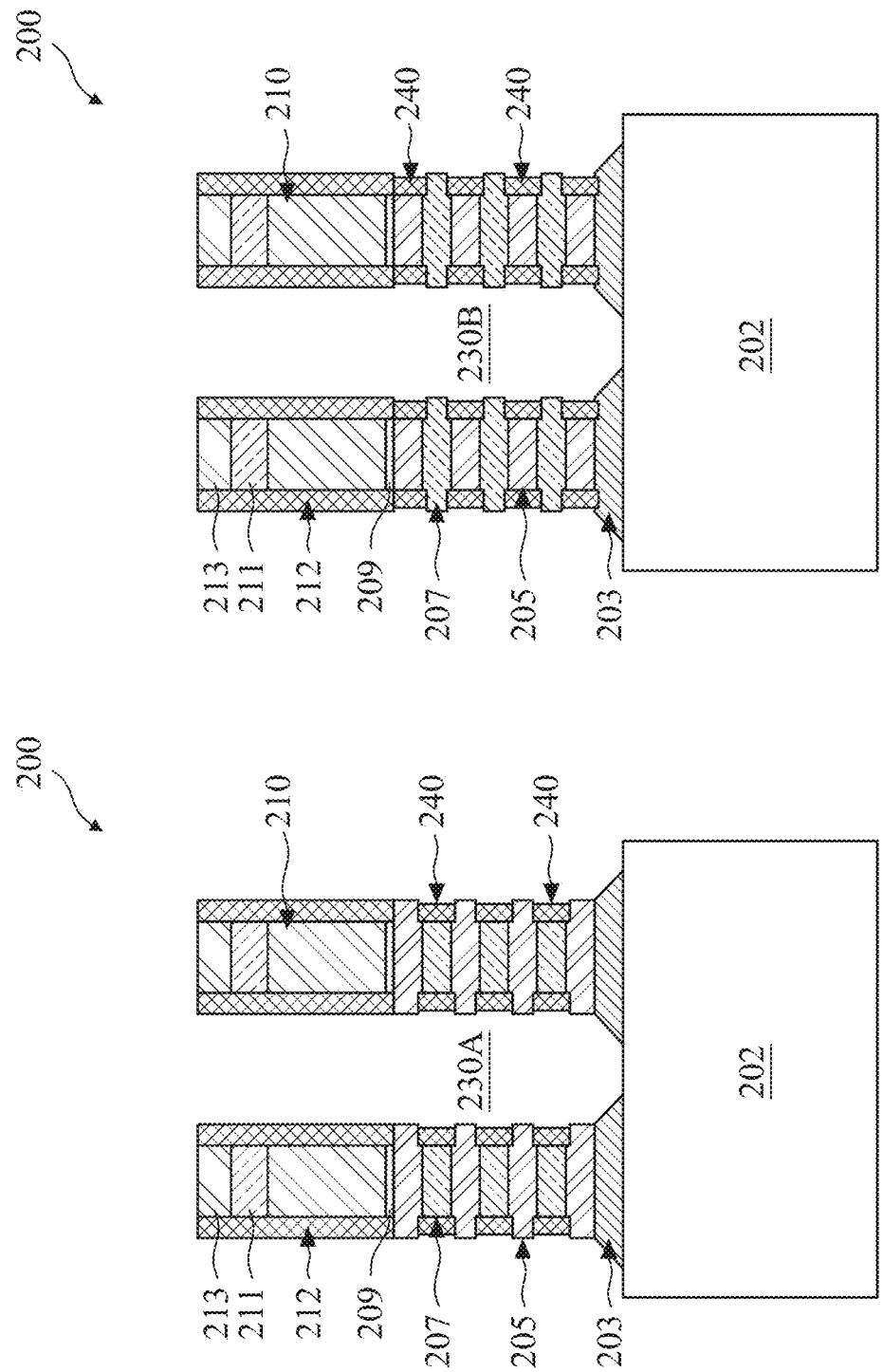
Figure 11D:
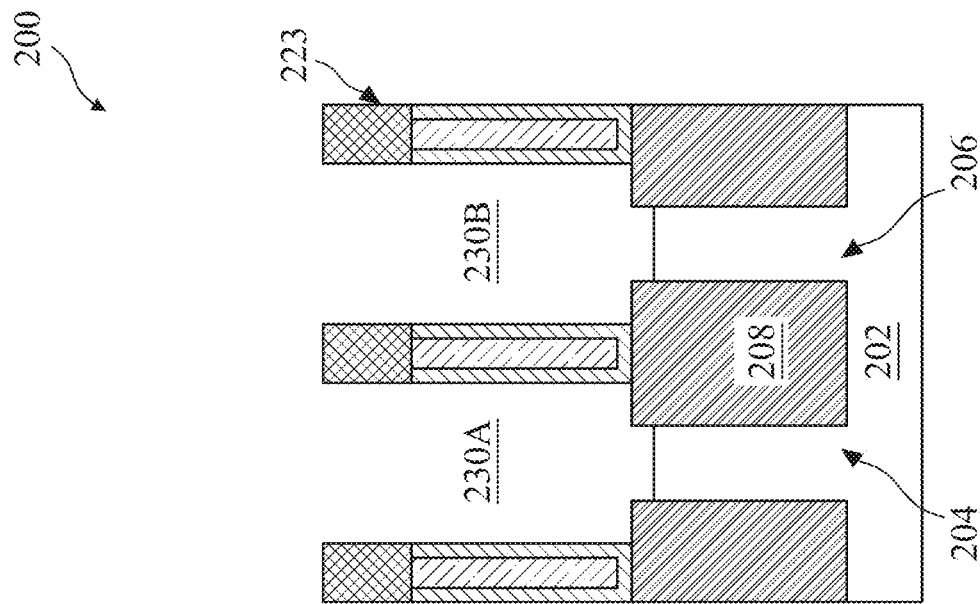
Figure 11C:
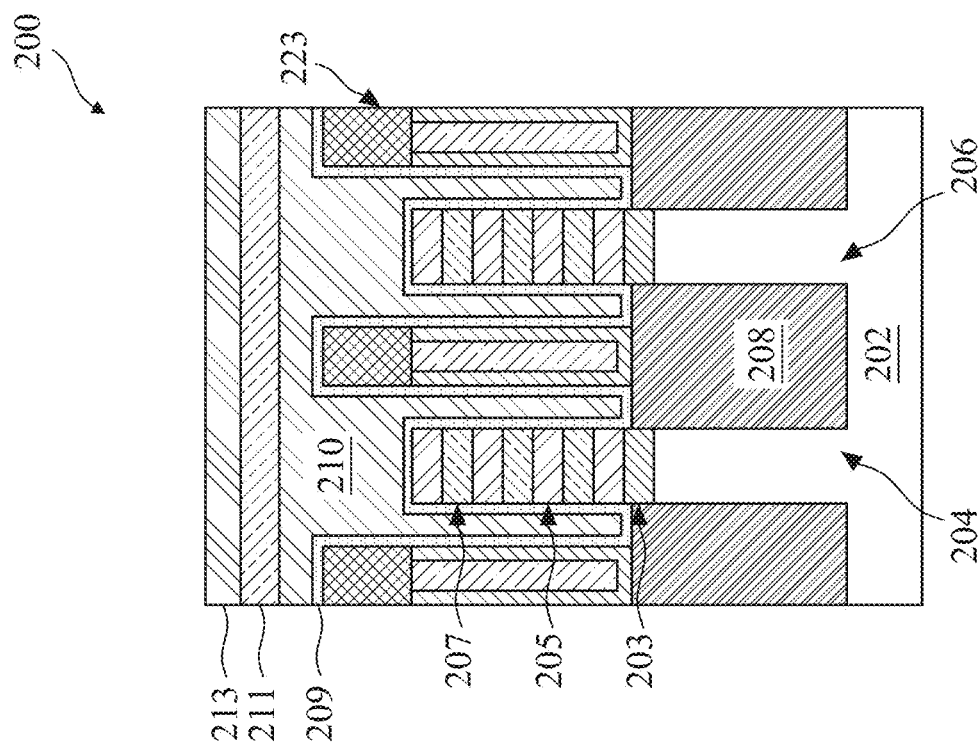
Figures 12A, 12B:
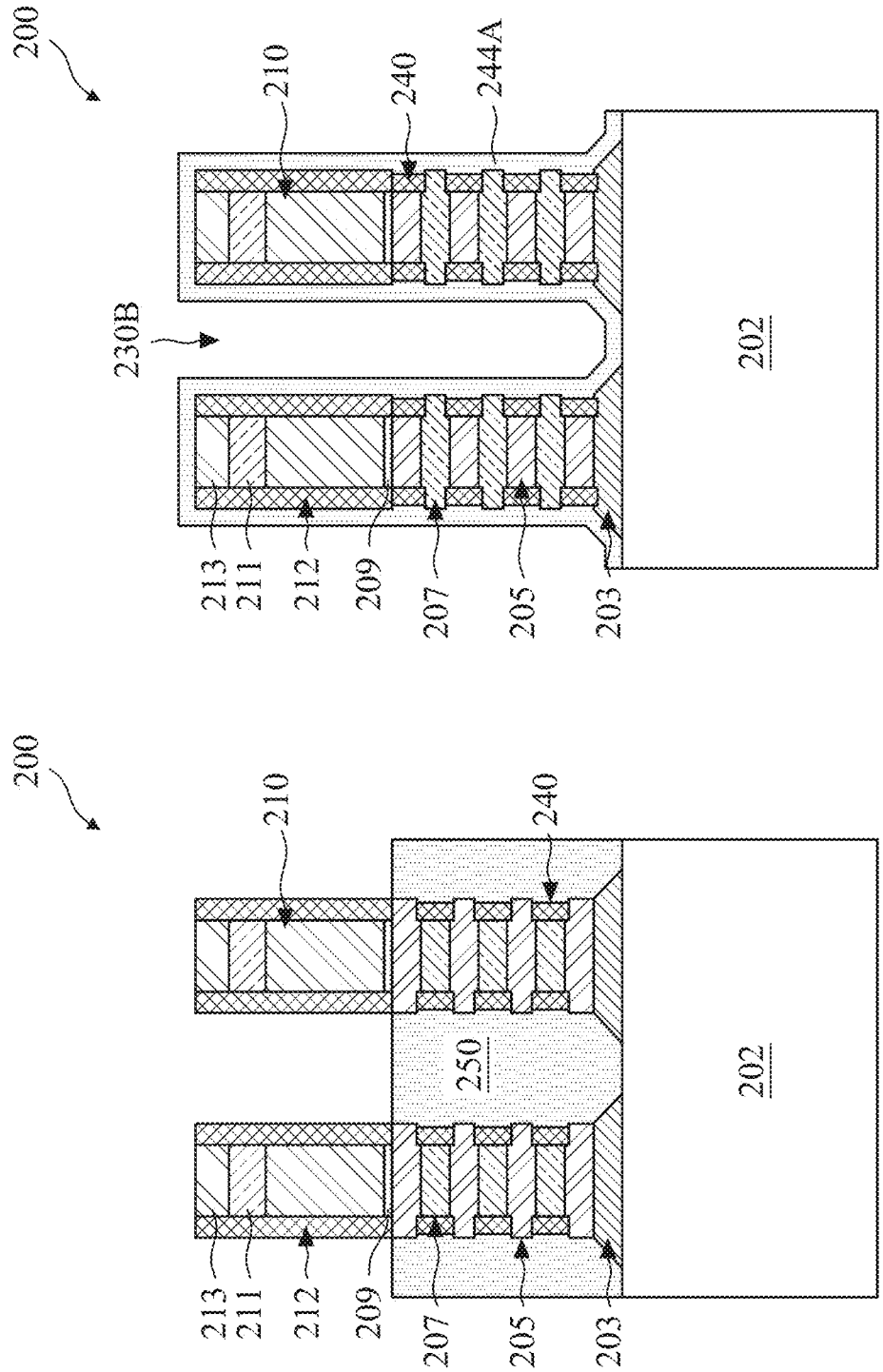
Figure 12C:
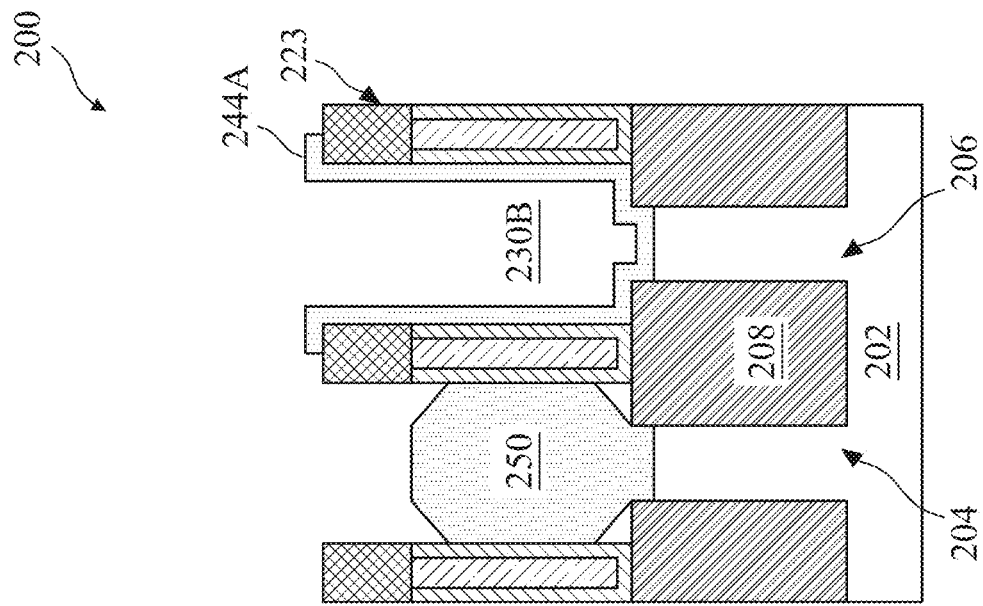
Figure 12D:
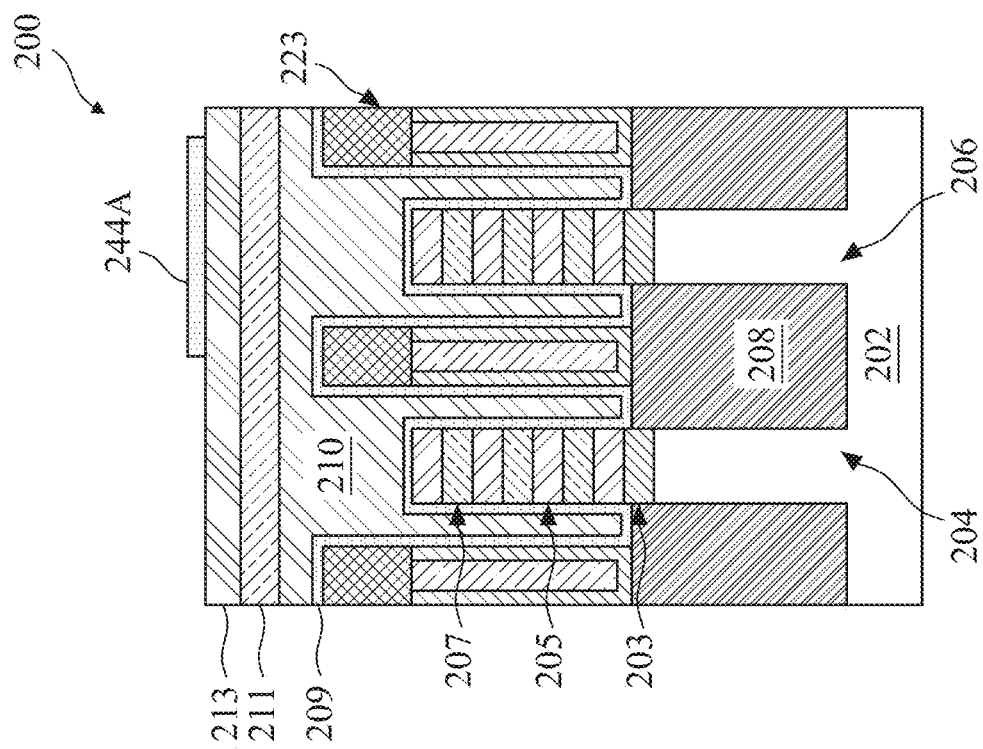

Thereafter, referring to FIGS. 8A-8D, method 100 at operation 112 forms an S/D recess 230A in an S/D region of the fin 204 and an S/D recess 230B in an S/D region of the fin 206. Referring to FIGS. 8A and 8B, before forming the S/D recesses 230A and 230B, method 100 first forms top spacers 212 on sidewalls of the dummy gate stack 210. The top spacers 212 may be a single-layer structure or a multi-layer structure and may include silicon oxide, silicon nitride, silicon carbide, silicon oxynitride, silicon oxycarbide, other suitable materials, or combinations thereof. Each spacer layer of the top spacers 212 may be formed by first depositing a dielectric layer over the dummy gate stack 210 and subsequently removing portions of the dielectric layer in an anisotropic etching process (e.g., a dry etching process), leaving portions of the dielectric layer on the sidewalls of the dummy gate stack 210 as the top spacers 212.

Subsequently, still referring to FIGS. 8A and 8B and further to FIG. 8D, method 100 removes portions of the ML in the S/D regions of the fins 204 and 206, stopping on the SiGe layer 203, by an etching process 302, which may be a dry etching process, a wet etching process, RIE, or combinations thereof. In the present embodiments, method 100 at operation 112 implements an etchant configured to remove the SiGe layer 203, the Si layers 205, and the SiGe layers 207. In other words, the etching process 302 is not selective to a particular material layer of the ML. In some examples, method 100 may implement a dry etching process using a chlorine-containing etchant (e.g., $Cl_2$, $SiCl_4$, $BCl_3$, other chlorine-containing gas, or combinations thereof), a bromine-containing etchant (e.g., HBr), other suitable etchants, or combinations thereof. In some embodiments, a depth of the S/D recesses 230A and 230B is controlled by adjusting duration, temperature, pressure, source power, bias voltage, bias power, etchant flow rate, other suitable parameters, or combinations thereof of the etching process 302. In the depicted embodiments, the etching process 302 is controlled such that the S/D recesses 230A and 230B expose portions of the substrate 202. A cleaning process may subsequently be performed to remove any etching residues in the S/D recesses 230A and 230B with hydrofluoric acid (HF) and/or other suitable solvents.

Collectively referring to FIGS. 9A-11D, method 100 at operations 114-118 forms inner spacers 240 on sidewalls of the non-channel layers in portions of the ML exposed in the S/D recesses 230A and 230B, respectively. In the present embodiments, the inner spacers 240 are configured to separate the epitaxial S/D features of the NFET and the PFET from their respective HKMGs formed between the channel layers. In the present embodiments, the inner spacers 240 are formed separately for the NFET and PFET as discussed in detail below.

Referring to FIGS. 9A-9D, method 100 at operation 114 selectively removes portions of the SiGe layers 207, which are configured as the non-channel layers of the NFET, to form recesses 234. To prevent inadvertent damage to the SiGe layers 207 configured as the channel layers of the PFET, a masking element 232A is formed over the device 200 and subsequently patterned to expose portions of the fin 204 while covering portions of the fin 206. The patterned masking element 232A may include at least a photoresist (resist) layer patternable by a photolithography method similar to that discussed in detail above with respect to, for example, forming the fins 204 and 206 as depicted in FIGS. 4A-4D. Subsequently, method 100 implements an etching process 304 to selectively remove portions of the SiGe layers 207 exposed in the S/D recess 230A without removing, or substantially removing, portions of the Si layers 205 and the SiGe layer 203. In the present embodiments, the etching process 304 is selective toward Ge at a content of at least about 20%, such that the SiGe layers 207 are etched at a higher rate than both the Si layers 205, which are substantially free of Ge, and the SiGe layer 203, which has a Ge content lower than about 20%. In some embodiments, the etching process 304 is a wet etching process that implements hydrogen peroxide ($H_2O_2$), a hydroxide (e.g., ammonium hydroxide ($NH_4OH$), tetramethylammonium hydroxide (TMAH), etc.), acetic acid ($CH_3COOH$), other suitable etchants, or combinations thereof. In some embodiments, the etching process 304 is a dry etching process that implements a fluorine-containing etchant, such as HF, $F_2$, $NF_3$, other fluorine-containing etchants, or combinations thereof. In the present embodiments, the duration of the etching process 304 is controlled to ensure that only portions of each SiGe layer 207 are etched to form the recesses 234. In some embodiments, various parameters (e.g., the etchants used) of the etching process 304 are tuned to ensure high etching uniformity between the recesses 234, such that a gate length $L_N$ for the NFET may be controlled to a desired value between the Si layers 205. After performing the etching process 304 to form the recesses 234, the patterned masking element 232A is removed from the device 200 by any suitable method, such as plasma ashing and/or resist stripping.

Now referring to FIGS. 10A-10D, method 100 at operation 116 selectively removes portions of the Si layers, which are configured as the non-channel layers of the PFET, to form recesses 236. A masking element 232B substantially similar to the masking element 232A may be applied over the device 200 and subsequently patterned to protect portions of the fin 204 while exposing portions of the fin 206. Subsequently, method 100 implements an etching process 306 to selectively remove portions of the Si layers 205 exposed in the S/D recess 230B without removing, or substantially removing, portions of the SiGe layer 203 and the SiGe layers 207. In the present embodiments, the etching process 306 has an etching selectivity toward Si, such that the Si layers 205 including elemental Si and is substantially free of other elements (e.g., Ge) are etched at a greater rate than both the SiGe layer 203 and the SiGe layers 207. After performing the etching process 306 to form the recesses 236, the patterned masking element 232B is removed from the device 200 by any suitable method, such as plasma ashing and/or resist stripping. In some embodiments, the etching process 306 is a dry etching process that implements hydrogen, a fluorine-containing etchant, such as $F_2$, $CF_4$, other fluorine-containing etchants, a nitrogen-containing etchant, such as $NH_3$, other nitrogen-containing etchants, or combinations thereof. In some embodiments, the etching process 306 is a wet etching process that implements a hydroxide, such as $NH_4OH$, other suitable etchants, or combinations thereof. In the present embodiments, the duration of the etching process 306 is controlled to ensure that only portions of the Si layer 205 are etched to form the recesses 236. In some embodiments, various parameters (e.g., the etchants used) of the etching process 306 are tuned to ensure high etching uniformity between the recesses 236, such that a gate length $L_P$ for the PFET may be controlled to a desired value between the SiGe layers 207 and 203. After performing the etching process 306 to form the recesses 236, the patterned masking element 232B is removed from the device 200 by any suitable method, such as plasma ashing and/or resist stripping. It is noted that the present embodiments do not limit the order in which the recesses 234 and 236 are formed in the SiGe layers 207 and the Si layer 205, respectively. In other words, although the recesses 234 are formed first at operation 114 and the recesses 236 are formed subsequently at operation 116 as depicted herein, the recesses 236 may alternatively be formed before forming the recesses 234 in some embodiments of the present disclosure.

Referring to FIGS. 11A-11D, method 100 at operation 118 forms the inner spacers 240 in the recesses 234 and 236. The inner spacers 240 may include any suitable dielectric material comprising silicon, carbon, oxygen, nitrogen, other elements, or combinations thereof. For example, the inner spacers 240 may include silicon nitride, silicon carbide, silicon oxide, carbon-containing silicon nitride (SiCN), carbon-containing silicon oxide (SiOC), oxygen-containing silicon nitride (SiON), carbon-and-oxygen-doped silicon nitride (SiOCN), a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), air, other suitable dielectric material, or combination thereof. The inner spacers 240 may each be configured as a single-layer structure or a multi-layer structure including a combination of the dielectric materials provided herein. In some embodiments, the inner spacers 240 have a different composition from that of the top spacers 212. In some embodiments, the inner spacers 240 and the top spacers 212 have substantially the same composition. Method 100 may form the inner spacers 240 by depositing one or more dielectric layers in the recesses 234 and 236 via any suitable deposition process, such as ALD, CVD, other suitable methods, or combinations thereof, and subsequently performing one or more etching processes to remove any excess dielectric material formed on sidewalls of the channel layers (i.e., the Si layers 205 in the fin 204 and the SiGe layers 207 in the fin 206).

Now referring to FIGS. 12A-12D, method 100 at operation 120 forms an n-type epitaxial S/D feature 250 in each S/D recess 230A. Each of the n-type epitaxial S/D features 250 is configured to form an NFET with the subsequently formed HKMG. The n-type epitaxial S/D features 250 may include one or more epitaxial layers of silicon (epi Si) or silicon carbon (epi SiC) doped with an n-type dopant such as arsenic, phosphorus, other n-type dopants, or combinations thereof. In the present embodiments, a hard mask layer 244A is formed over the device 200 and subsequently patterned to protect the fin 206 while exposing the fin 204 before forming the n-type epitaxial features 250. The hard mask layer 244A may include a suitable dielectric material and patterned by a photolithography process using a masking element (not depicted) similar to the masking element 232A discussed in detail above with respect to operation 114. In the present embodiments, one or more epitaxy growth processes are performed to grow an epitaxial material in each S/D recess 230A. For example, method 100 may implement an epitaxy growth process as discussed above with respect to forming the Si layers 205 and the SiGe layers 207 of the ML. In some embodiments, the epitaxial material is doped in-situ by adding a dopant to a source material during the epitaxy growth process. In some embodiments, the epitaxial material is doped by an ion implantation process after performing a deposition process. In some embodiments, an annealing process is subsequently performed to activate the dopants in the n-type epitaxial S/D features 250. Thereafter, the patterned hard mask layer 244A is removed from the device 200 by a suitable process, such as a dry etching process, a wet etching process, or a combination thereof.

Figures 13A, 13B:
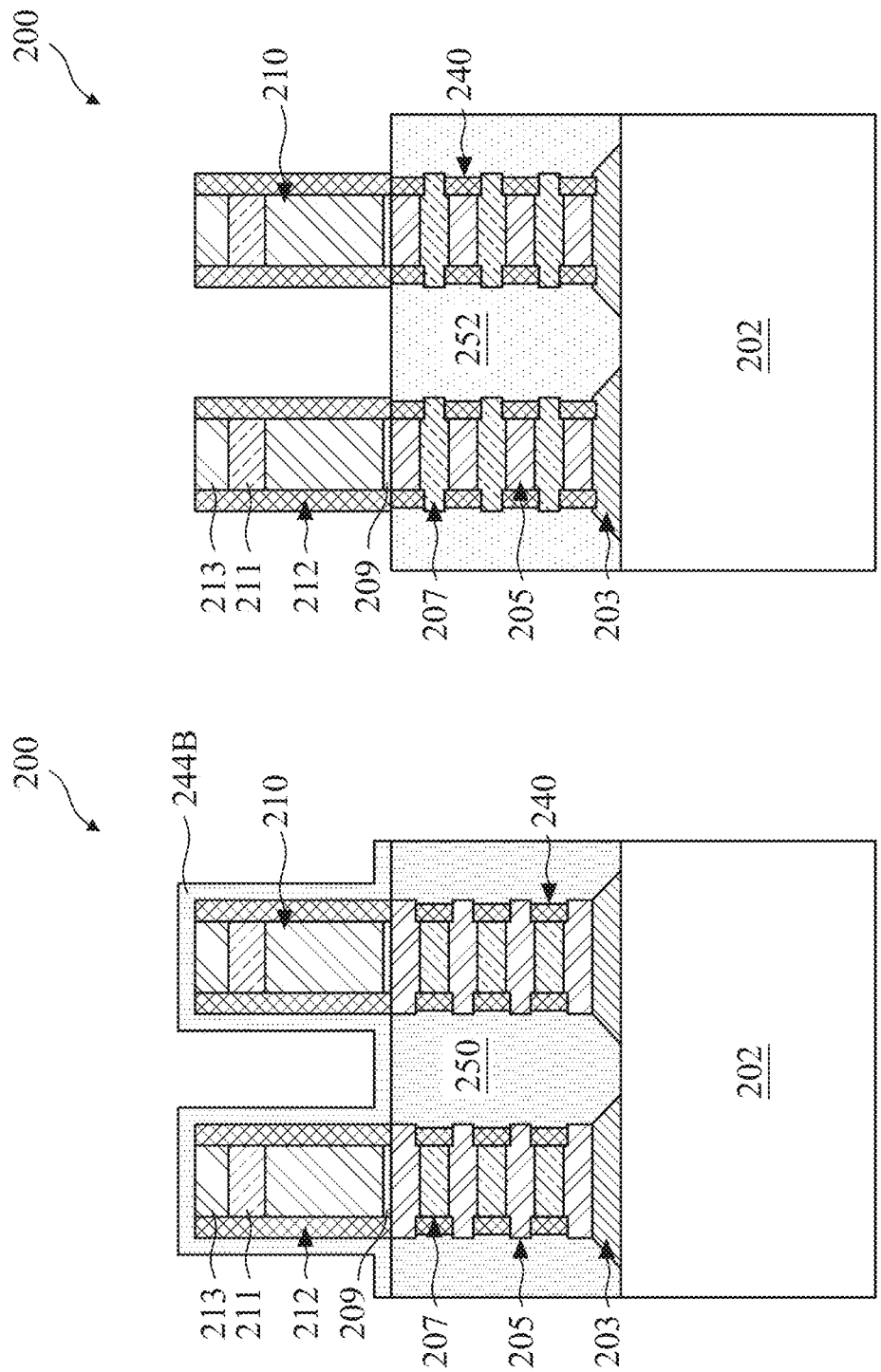
Figure 13C:
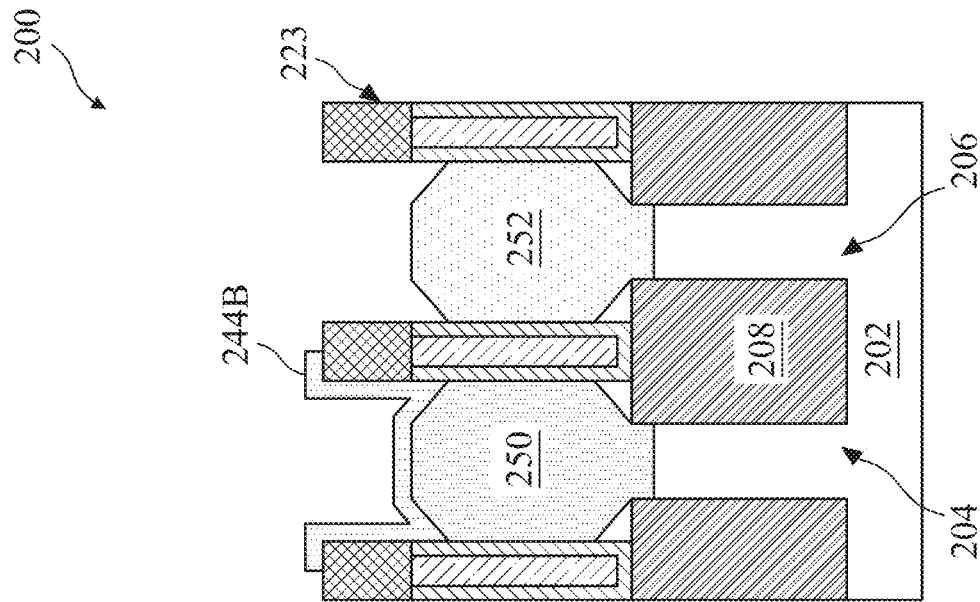
Figure 13D:
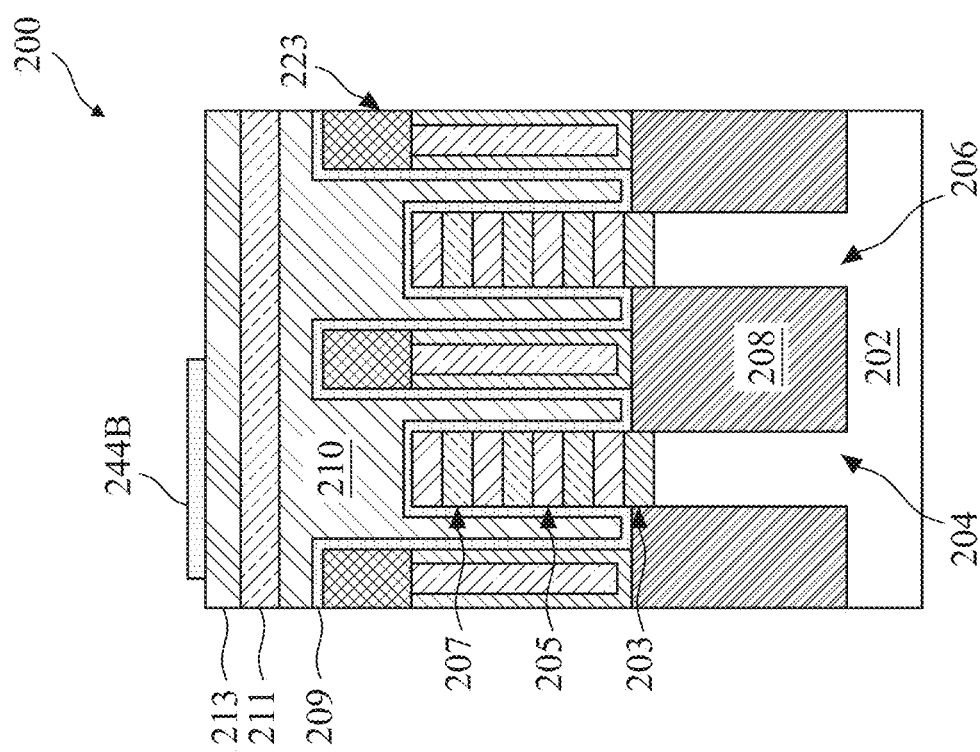

Subsequently, referring to FIGS. 13A-13B, method 100 at operation 122 forms a p-type epitaxial S/D feature 252 in each S/D recess 230B. Each of the p-type epitaxial S/D features 252 is configured to form a PFET with the subsequently formed HKMG. The p-type epitaxial S/D features 252 may include one or more epitaxial layers of silicon germanium (cpi SiGe) doped with a p-type dopant such as boron, germanium, indium, other p-type dopants, or combinations thereof. In the present embodiments, a hard mask layer 244B is formed over the device 200 and subsequently patterned to protect the fin 204 while exposing the fin 206 before forming the p-type epitaxial S/D features 252. The hard mask layer 244B may include a suitable dielectric material and patterned by a photolithography process using a masking element (not depicted) similar to the masking element 232A as discussed in detail above with respect to operation 114. In the present embodiments, the p-type epitaxial S/D features 252 are formed and doped in one or more epitaxy growth and doping processes discussed above with respect to forming the n-type epitaxial features 250. Thereafter, the patterned hard mask layer 244B is removed from the device 200 by a suitable etching process similar to that discussed above with respect to operation 120.

Figures 14A, 14B:
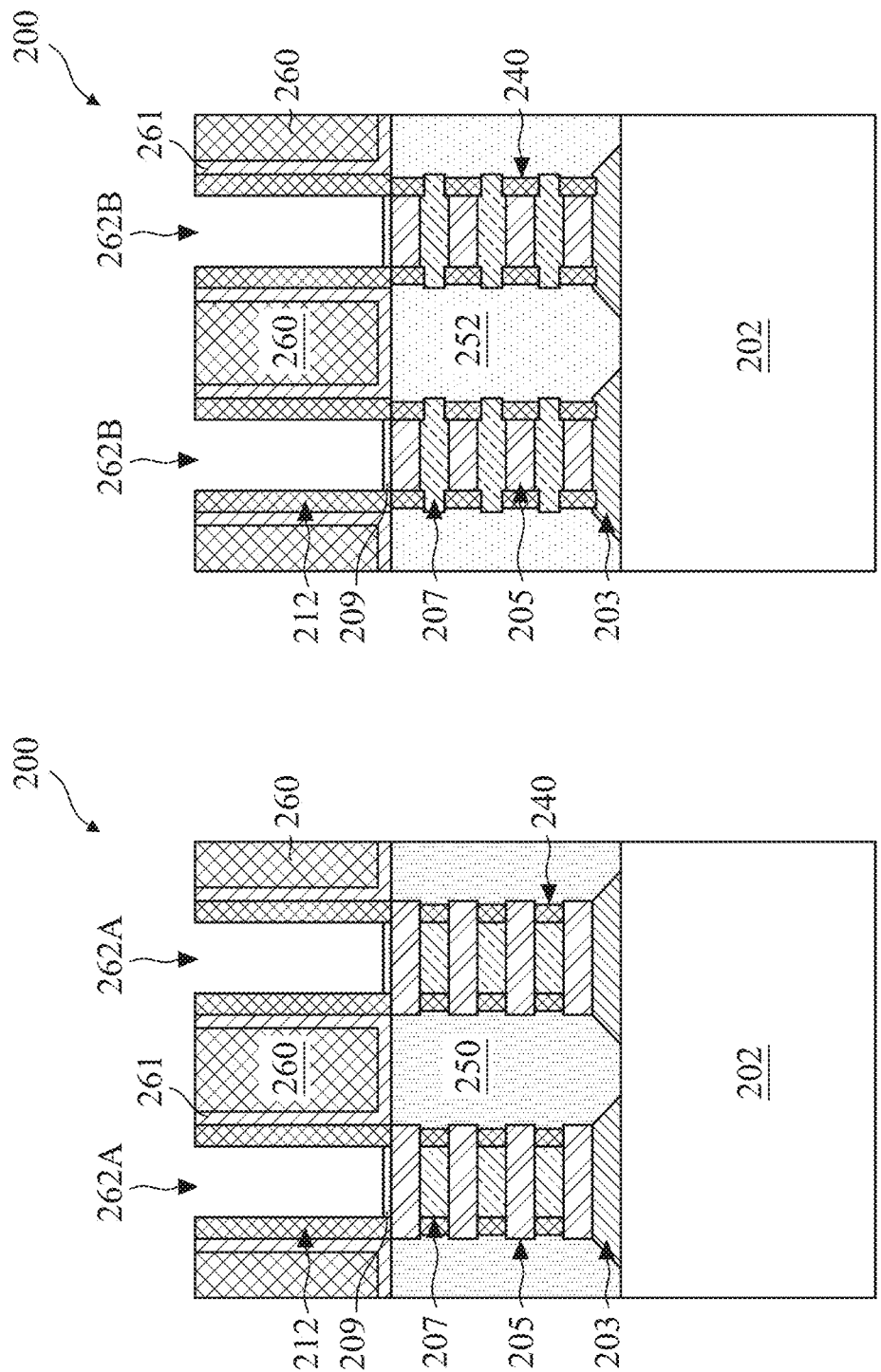
Figure 14D:
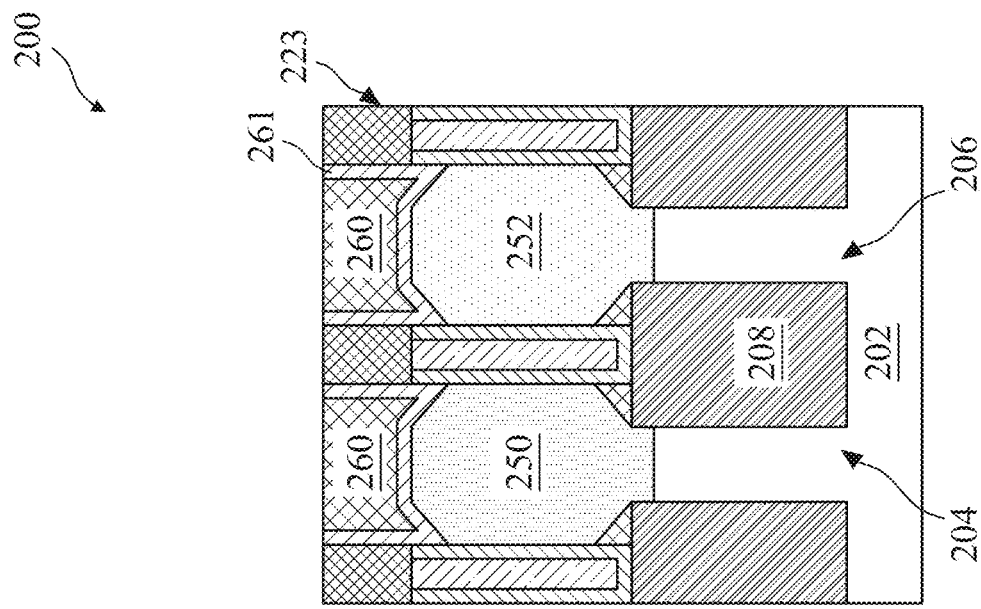
Figure 14C:
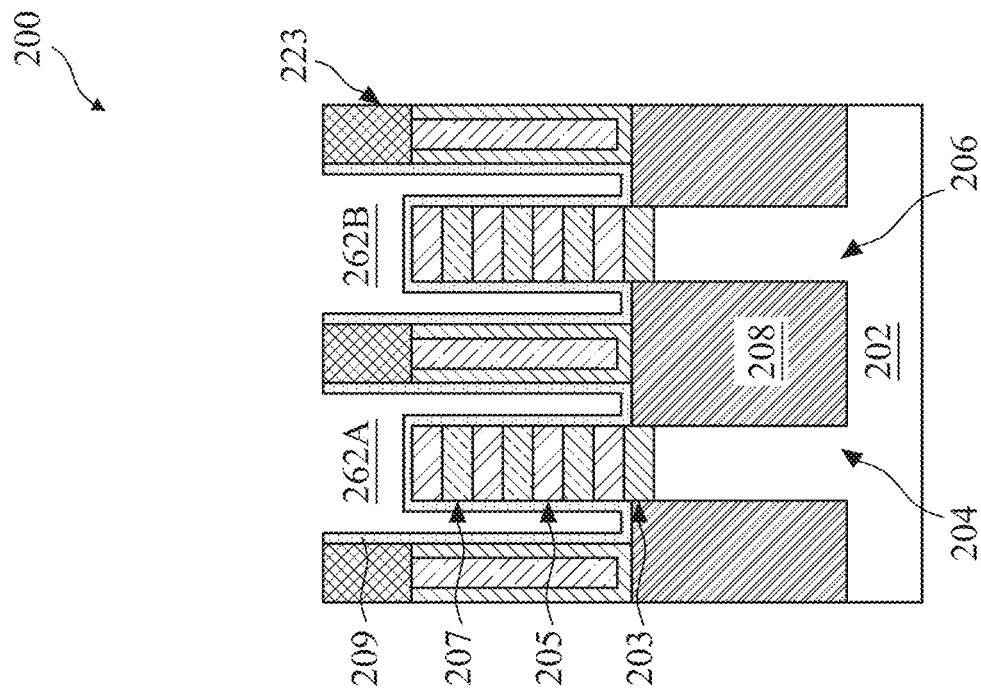
Figure 15A:
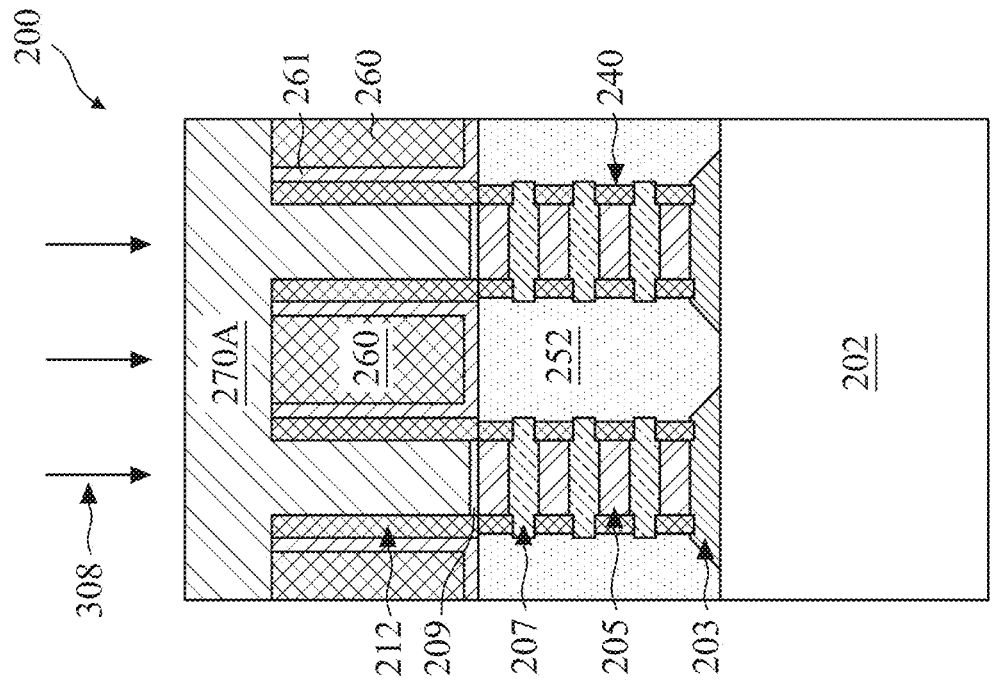
Figure 15B:
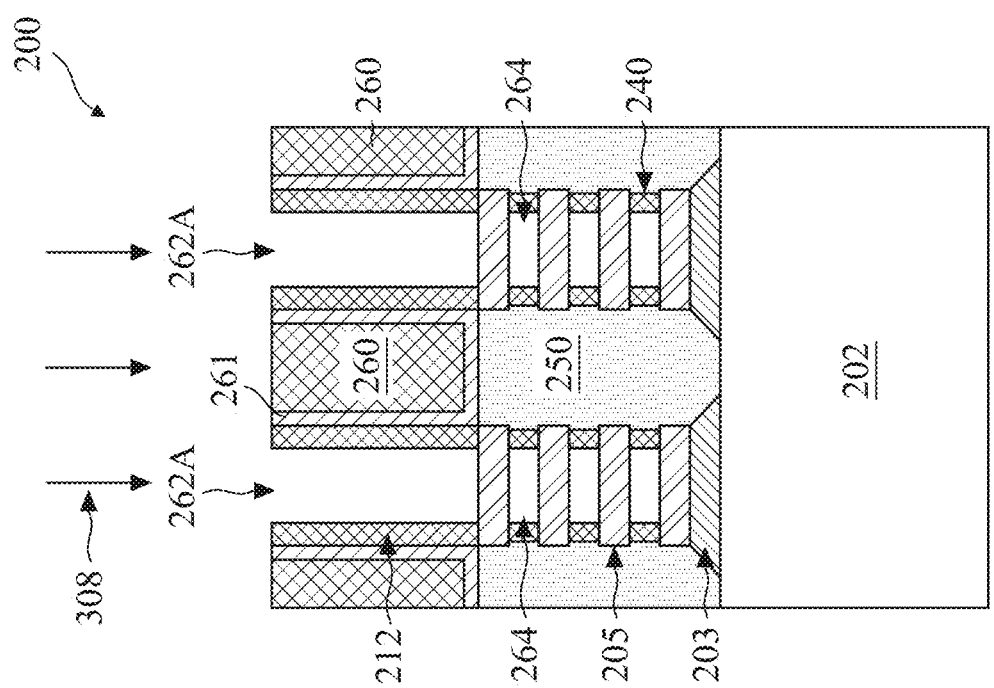
Figure 15C:
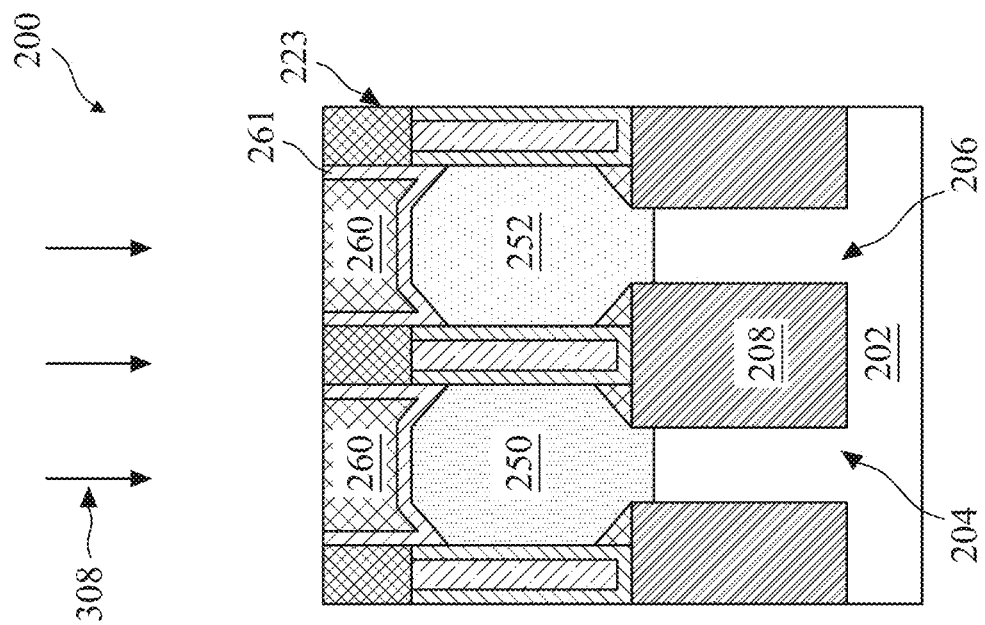
Figure 15D:
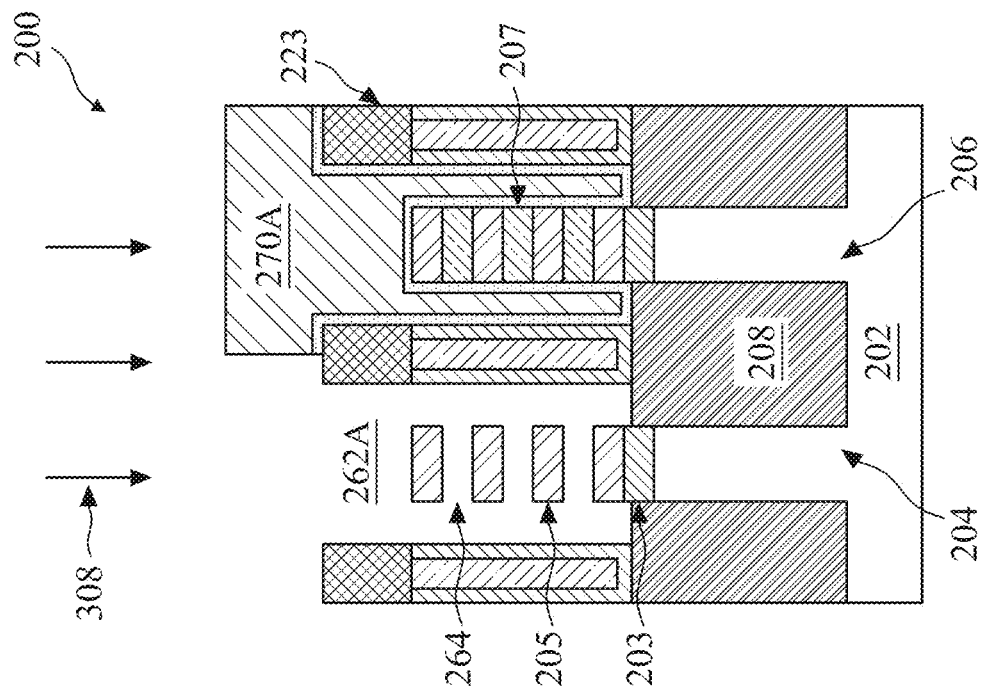
Figures 16A, 16B:
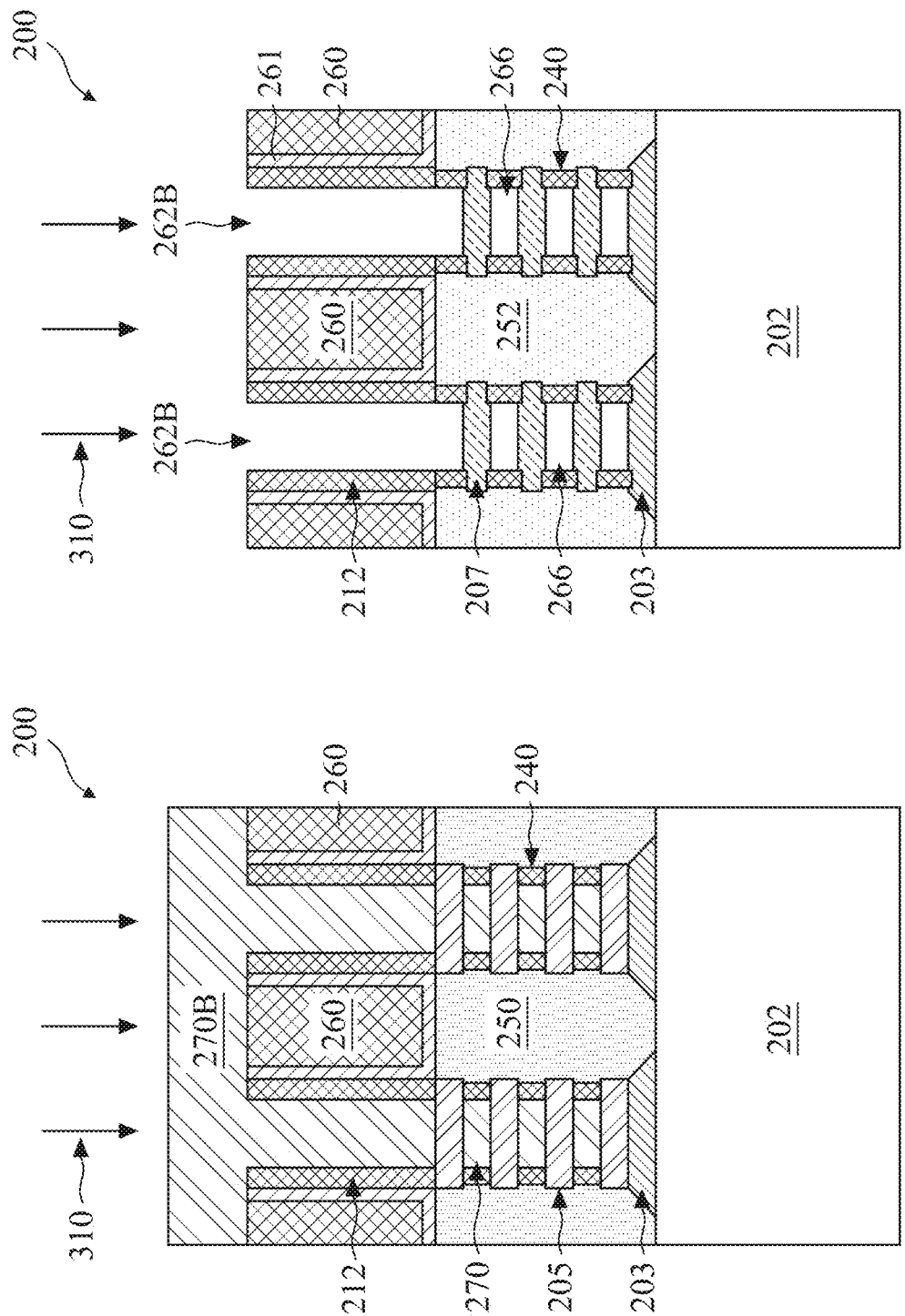
Figure 16C:
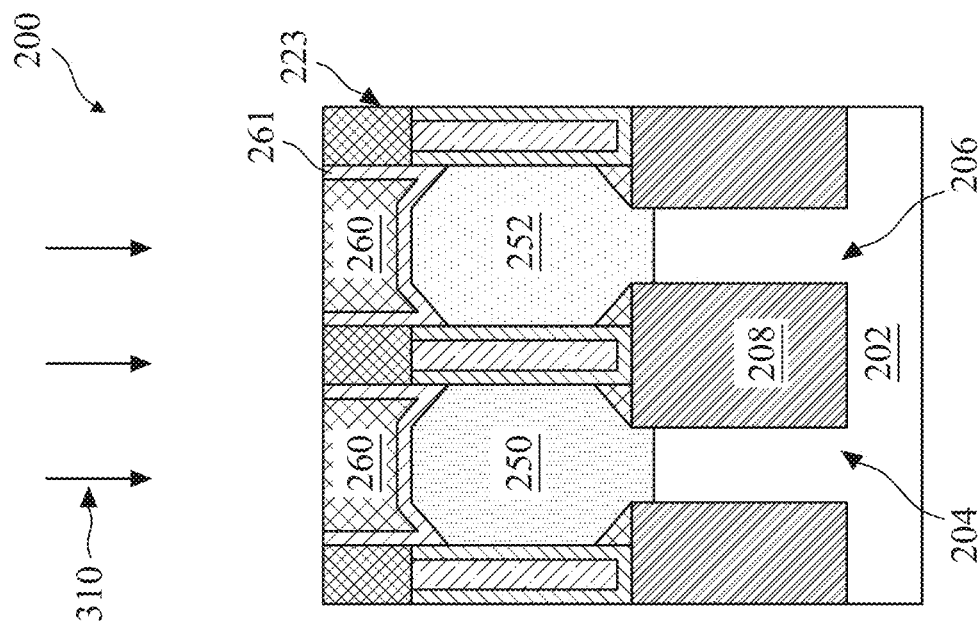
Figure 16D:
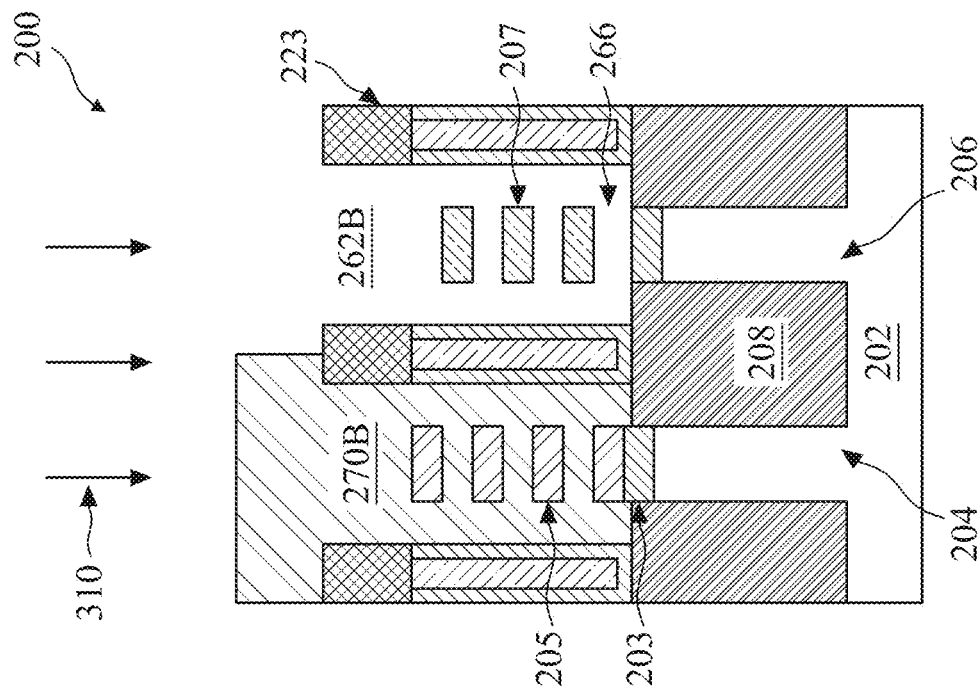

Referring to FIGS. 14A-14D, method 100 at operation 124 removes the dummy gate stack 210 to form a gate trench 262A exposing the channel region of the fin 204 and a gate trench 262B exposing the channel region of the fin 206. Before removing the dummy gate stack 210, method 100 forms an interlayer dielectric (ILD) layer 260 over the n-type epitaxial S/D features 250 and the p-type epitaxial S/D features 252 by, for example, CVD, FCVD, other suitable methods, or combinations thereof. The ILD layer 260 may include silicon oxide, a low-k dielectric material, TEOS, doped silicon oxide (e.g., BPSG, FSG, PSG, BSG, etc.), other suitable dielectric materials, or combinations thereof. In some embodiments, as depicted in FIGS. 14A, 14B, and 14D, method 100 first forms an etch-stop layer (ESL) 261 over the n-type epitaxial S/D features 250 and the p-type epitaxial S/D features 252 before forming the ILD layer 260. The ESL 261 may include silicon nitride, silicon carbide, carbon-containing silicon nitride (SiCN), oxygen-containing silicon nitride (SiON), carbon-and-oxygen-doped silicon nitride (SiOCN), aluminum nitride, a high-k dielectric material, other suitable materials, or combinations thereof, and may be formed by CVD, ALD, PVD, other suitable methods, or combinations thereof. Subsequently, method 100 may planarize the ESL 261 and the ILD layer 260 in one or more CMP processes to expose a top surface of the dummy gate stack 210. Thereafter, referring to FIGS. 14A-14C, at least portions of the dummy gate stack 210 are removed from the device 200 to form the gate trench 262A and the gate trench 262B by any suitable etching process, such as a dry etching process. In the present embodiments, the interfacial layer 209 remains over the ML after removing the dummy gate stack 210.

Collectively referring to FIGS. 15A-16D, method 100 at operations 126 and 128 performs the sheet formation process for the fin 204 and the fin 206 separately, thereby forming openings 264 between the Si layers 205 in the fin 204 and openings 266 between the SiGe layers 207 in the fin 206. Referring to FIGS. 15A-15D, method 100 at operation 126 forms a masking element 270A over the device 200 and subsequently patterns the masking element 270A to protect the channel region of the fin 206 and expose the channel region of the fin 204. The masking element 270A may be substantially similar to the masking element 232A in composition as discussed above with respect to, for example, forming the recesses 234 as depicted in FIGS. 9A-9D. Thereafter, the SiGe layers 207 are selectively removed from the channel region of the fin 204 by an etching process 308 that does not, or does not substantially, remove the SiGe layer 203 and the Si layers 205 from the channel region of the fin 204, thereby forming the openings 264.

As discussed above, the SiGe layers 207 in the channel region of the fin 204 are considered the non-channel layers, while the Si layers 205 are considered the channel layers configured to form the NFET. In the present embodiments, the etching process 308 includes dry etching, wet etching, RIE, or combinations thereof, and utilizes an etchant with an etching selectivity toward Ge relative to Si, where the composition of Ge is at least about 20%. Accordingly, the etching process 308 removes the SiGe layers 207 without removing, or substantially removing, the SiGe layer 203, which includes less than about 20% of Ge, and the Si layers 205, which are substantially free of Ge. In some embodiments, the etching process 308 is similar to the etching process 304 in terms of the etchant(s) used and/or other relevant etching parameters. Of course, other suitable etching processes different from the etching process 304 may also be applicable, so long as they are effective at selectively removing the SiGe layers 207 with respect to the Si layers 205 and the SiGe layer 203. In the present embodiments, the etching process 308 is controlled to ensure that all of the SiGe layers 207 are removed from the fin 204, such that the openings 264 are formed between the Si layers 205 (and between the SiGe layer 203 and the bottommost Si layer 205), which are the channel layers of the NFET. Thereafter, the patterned masking element 270A is removed from the device 200 by any suitable method, such as plasma ashing and/or resist stripping. Subsequent to or concurrent with the removal of the SiGe layers 207, method 100 at operation 126 removes portions of the interfacial layer 209 disposed over the channel region of the fin 204.

Subsequently, referring to FIGS. 16A-16D, method 100 at operation 128 forms a masking element 270B over the device 200 and subsequently patterns the masking element 270B, which may be substantially similar to the masking element 270A in composition, to protect the channel region of the fin 206 and expose the channel region of the fin 204. Thereafter, the Si layers 205 are selectively removed from the channel region of the fin 206 by an etching process 310 that does not, or does not substantially, remove the SiGe layer 203 and the SiGe layers 207 from the channel region of the fin 206, thereby forming the openings 266.

As discussed above, the Si layers 205 in the channel region of the fin 206 are considered the non-channel layers, while the SiGe layers 207 are considered the channel layers configured to form the PFET. In the present embodiments, the etching process 310 includes dry etching, wet etching, RIE, or combinations thereof, and utilizes an etchant with an etching selectivity toward Si relative to Ge. In some embodiments, the etching process 310 is configured to remove material layers having a Si content greater than about 90%. Accordingly, the etching process 310 removes the Si layers 205 without removing, or substantially removing, the SiGe layer 203, which includes less than about 90% of Si, and the SiGe layers 207, which includes less than about 80% of Si. In some embodiments, the etching process at operation 128 is similar to etching process 306 in terms of the etchant(s) used and/or other relevant etching parameters. Of course, other suitable etching processes different from the etching process 306 may also be applicable, so long as they are effective at selectively removing the Si layers 205 with respect to the SiGe layers 203 and 207. In the present embodiments, the etching process 310 is controlled to ensure that all of the Si layers 205 are removed from the fin 206, such that the openings 266 are formed between the SiGe layers 207 (and between the SiGe layer 203 and the bottommost SiGe layer 207) which are the channel layers of the PFET. Thereafter, the patterned masking element 270B is removed from the device 200 by any suitable method, such as plasma ashing and/or resist stripping. Subsequent to or concurrent with the removal of the Si layers 205, method 100 at operation 128 removes portions of the interfacial layer 209 disposed over the channel region of the fin 206. Although in the depicted embodiments the openings 264 are formed before the openings 266, the order in which the openings 264 and 266 are formed is not limited as such. For example, method 100 may first form the openings 266 before forming the openings 264.

Now referring to FIGS. 17A-17D, method 100 at operation 130 forms a HKMG 280A over the channel region of the fin 204 to form the NFET and a HKMG 280B over the channel region of the fin 206 to form the PFET. In the present embodiments, top portions of the HKMGs 280A and 280B are formed in the gate trenches 262A and 262B, respectively, and bottom portions of the HKMGs 280A and 280B are formed in the openings 264 and 266, respectively.

In the present embodiments, the HKMGs 280A and 280B each include at least a high-k dielectric layer 282 disposed over and surrounding the channel layers of the NFET and the PFET and a metal gate electrode disposed over the high-k dielectric layer 282. In the present embodiments, the high-k dielectric layer 282 includes any suitable high-k dielectric material, such as hafnium oxide, lanthanum oxide, other suitable materials, or combinations thereof. In the present embodiments, the metal gate electrode of the HKMG 280A includes at least a work function metal (WFM) layer 284A disposed over the high-k dielectric layer 282 and a conductive layer 286 disposed over the WFM layer 284A, and the metal gate electrode of HKMG 280B includes at least a WFM layer 284B disposed over the high-k dielectric layer 282 and the conductive layer 286 disposed over the WFM layer 284B. The WFM layer 284A and the WFM layer 284B may each be a single-layer structure or a multi-layer structure including at least a p-type WFM layer, an n-type WFM layer, or a combination thereof. The conductive layer 286 may include Cu, W, Al, Co, Ru, other suitable materials, or combinations thereof. In the depicted embodiments, the HKMGs 280A and 280B each includes an interfacial layer 281 formed between each channel layer and the high-k dielectric layer 282. The HKMGs 280A and 280B may further include other layers (not depicted), such as a capping layer, a barrier layer, other suitable layers, or combinations thereof. In some embodiments, the number of material layers included in each of the HKMGs 280A and 280B is determined by the size of the openings 264 and 266, respectively. Various layers of the HKMGs 280A and 280B may be formed by any suitable method, such as chemical oxidation, thermal oxidation, ALD, CVD, PVD, plating, other suitable methods, or combinations thereof.

Generally, the threshold voltage $V_t$ of a device may be tuned by adjusting the type(s) of WFM layer(s) included in the device's gate electrode, and the device's $I_{off\_source}$, the source leakage current when the gate voltage is 0 V and the drain voltage is VDD, has a value that is exponentially and inversely related with the value of $V_t$. In a CMOSFET where the material utilized for the channel regions of the NFET and the PFET is the same, e.g., both including Si, variation in $I_{off\_source}$ as a function of WF is different between the NFET and the PFET. For example, referring to FIG. 18, the linear correlation 402, which describes $I_{off\_source}$ as a function of WF for an NFET, has a negative slope and the linear correlation 404, which describes $I_{off\_source}$ as a function of WF for a PFET, has a positive slope. Such disparity between WFs at a given $V_t$ generally does not allow the NFET and the PFET to share WFM layer(s) of the same composition(s), thereby increasing the processing complexity associated with the HKMG formation, e.g., operation 130 discussed above. In the present embodiments, the channel region of the PFET is configured with SiGe, which has an energy band structure different from that of Si. Such difference causes a lateral shift of the linear correlation 404 toward the linear correlation 402, so that at a crossover point 410, both the NFET and the PFET may be tuned to the same (or substantially the same) WF value, namely WF*, for a given I* value that corresponds to a desired $V_t$. In other words, the incorporation of SiGe in the channel region of the PFET reduces the WF needed to configure the HKMG 280B to achieve a desired $V_t$ for the device 200. Accordingly, WFM layer(s) of the same or substantially similar compositions may be formed in both the NFET and the PFET, effectively reducing the processing complexity and cost of forming the HKMGs 280A and 280B.

In the present embodiments, the SiGe layer 207 in the channel region of the fin 206 allows the WFM layers 284A and 284B to have WFM layers of the same or substantially similar compositions, such that the WF of each of the HKMG 280A and the HKMG 280B is tuned to the approximate value of WF*, which is about 4.6 eV±0.15 eV at a corresponding I* of about 0.1 A/m±2 orders of magnitude. In some embodiments, the WFM layers 284A and 284B each include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable WFM layers, or combinations thereof. Accordingly, rather than adjusting the WF of the HKMGs 280A and 280B independently by incorporating different WFM layers, the present embodiments provide methods of performing sheet formation process separately (i.e., separate selective etching processes) for the NFET and PFET in order to obtain channel regions including different semiconductor materials capable of shifting the WF of the NFET and PFET independent of the effect of the WFM layers.

Comparing FIG. 17A with FIG. 17B, the portion of the HKMG 280A disposed over the topmost Si layer 205 is above or at substantially the same level as a top surface of the n-type epitaxial S/D features 250 (i.e., above or at substantially the same level as a bottom surface of the ILD layer 260), while the HKMG 280B disposed over the topmost SiGe layer 207 extends to below the top surface of the p-type epitaxial S/D features 252 (i.e., below the bottom surface of the ILD layer 260). Such offset in gate height is attributed to the arrangement of alternating Si layers 205 and SiGe layers 207 (and 203), which are separately removed to form channel region of the PFET and the NFET, respectively. Furthermore, referring to FIGS. 17C, 17E, and 17F, where FIGS. 17E and 17F depict in greater detail the HKMGs 280A and 280B, respectively, the channel region of the fin 204 is defined by a height $H_n$ and the channel region of the fin 206 is defined by a height $H_p$, where $H_n$ and $H_p$ are both measured from a top surface of the SiGe layer 203 and where $H_n$ is greater than $H_p$. For embodiments in which the Si layer 205 and the SiGe layer 207 have substantially the same thickness T as discussed above with respect to FIGS. 3A-3D, such difference in channel height is attributed to the number of the Si layers 205 in the channel region of the fin 204 being one more than the number of the SiGe layers 207 in the channel region of the fin 206.

Thereafter, method 100 at operation 132 may perform additional processing steps to the device 200. For example, method 100 may form S/D contacts (not depicted) over the epitaxial S/D features 250 and 252, respectively. Each S/D contact may include any suitable conductive material, such as Co, W, Ru, Cu, Al, Ti, Ni, Au, Pt, Pd, other suitable conductive materials, or combinations thereof. Method 100 may form an S/D contact opening in the ILD layer 260 via a series of patterning and etching processes and subsequently deposit a conductive material in the S/D contact opening using any suitable method, such as CVD, ALD, PVD, plating, other suitable processes, or combinations thereof. In some embodiments, a silicide layer (not depicted) is formed between the epitaxial S/D features 250 and 252 and their respective S/D contacts. The silicide layer may include nickel silicide, cobalt silicide, tungsten silicide, tantalum silicide, titanium silicide, platinum silicide, erbium silicide, palladium silicide, other suitable silicide, or combinations thereof. The silicide layer may be formed over the device 200 by a deposition process such as CVD, ALD, PVD, or combinations thereof. Subsequently, though not depicted, method 100 may form additional features over the device 200, such as an ESL disposed over the ILD layer 260, an ILD layer disposed over the ESL, a gate contact in the ILD layer to contact the HKMG 280, vertical interconnect features (e.g., vias), horizontal interconnect features (e.g., conductive lines), additional intermetal dielectric layers (e.g., ESLs and ILD layers), other suitable features, or combinations thereof.

Although not intended to be limiting, one or more embodiments of the present disclosure provide many benefits to a semiconductor device and the formation thereof. For example, the present disclosure provides methods of forming a GAA device including an NFET and a PFET in which the channel region of the NFET and the channel region of the PFET include different materials (Si layers and SiGe layers, respectively) configured to adjust the WF of the respective metal gate stacks in the NFET and the PFET, thereby allowing the $V_t$ of the device be tuned with WFM layer(s) of the same compositions to simplify fabrication processes associated with metal gate formation. In the present embodiments, channel regions of the NFET and the PFET are formed by separate sheet formation processes each selective to removing the non-channel layers of the device (e.g., removing the SiGe layers with respect to the Si layers for the NFET). In some embodiments, an additional SiGe layer having less Ge content is formed between the stacks of channel layers and the substrate and configured to protect the substrate from inadvertent etching during the sheet release processes. Embodiments of the disclosed methods can be readily integrated into existing processes and technologies for manufacturing GAA FETs.

In one aspect, the present disclosure provides a semiconductor structure that includes a first stack of semiconductor layers disposed over a semiconductor substrate, where the first stack of semiconductor layers includes a first silicon germanium (SiGe) layer and a plurality of silicon (Si) layers disposed over the first SiGe layer, and where the Si layers are substantially free of Ge, a second stack of semiconductor layers disposed adjacent to the first stack of semiconductor layers, where the second stack of semiconductor layers includes the first SiGe layer and a plurality of second SiGe layers disposed over the first SiGe layer, and where the first SiGe layer and the second SiGe layers have different compositions. In the present embodiments, the semiconductor structure further includes a first metal gate stack interleaved with the first stack of semiconductor layers to form a first device and a second metal gate stack interleaved with the second stack of semiconductor layers to form a second device, where the first device and the second device have different conductivity types.

In another aspect, the present disclosure provides a semiconductor structure that includes a first semiconductor fin protruding from a substrate, where a channel region of the first semiconductor fin includes a stack of silicon (Si) layers disposed over a first silicon germanium (SiGe) layer, a second semiconductor fin protruding from the substrate, where a channel region of the second semiconductor fin includes a stack of second SiGe layers disposed over the first SiGe layer, where an amount of Ge in the second SiGe layers is greater than an amount of Ge in the first SiGe layer, and where a number of the second SiGe layers in the second semiconductor fin is one more than a number of the Si layers in the first semiconductor fin. In the present embodiments, the semiconductor structure further includes a first metal gate stack engaged with the channel region of the first semiconductor fin and a second metal gate stack engaged with the channel region of the second semiconductor fin.

In yet another aspect, the present disclosure provides a method of forming a semiconductor structure, the method including forming a first silicon germanium-based (SiGe-based) layer over a substrate, forming a multi-layer stack (ML) of alternating silicon-based (Si-based) layers and second SiGe-based layers over the first SiGe-based layer, where the first SiGe-based layer and the second SiGe-based layers have different compositions, and where the ML includes one more second SiGe-based layers than Si layers, forming a first fin and a second fin adjacent to the first fin in the ML, forming a dummy gate stack over a channel region of the first fin and a channel region of the second fin, forming n-type source/drain (S/D) features in the first fin, and forming p-type S/D features in the second fin. In the present embodiments, the method further includes removing the dummy gate stack between the n-type S/D features and between the p-type S/D features to form a first gate trench and a second gate trench, respectively, removing the second SiGe-based layers in the first fin to form first openings between the Si-based layers, removing the Si-based layers in the second fin to form second openings between the second SiGe-based layers and between the second SiGe-based layer and the first SiGe-based layer, and forming metal gate stacks in the first gate trench, the second gate trench, the first openings, and the second openings.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a first base fin and a second base fin arising from the substrate;
an isolation structure disposed over the substrate and between the first base fin and the second base fin;
a first number of nanostructures disposed over the first base fin;
a second number of nanostructures disposed over the second base fin;
a first gate structure wrapping around at least one of the first number of nanostructures;
a second gate structure wrapping around each of the second number of nanostructures; and
a dielectric fin disposed over the isolation structure and sandwiched between the first gate structure and the second gate structure,
wherein a composition of the first number of nanostructures is different from a composition of the second number of nanostructures.

2. The semiconductor structure of claim 1, wherein the first number is greater than the second number.

3. The semiconductor structure of claim 1,
wherein the first number of nanostructures comprise silicon (Si),
wherein the second number of nanostructures comprise silicon germanium (SiGe).

4. The semiconductor structure of claim 1, further comprising:
a first bottom silicon germanium layer over the first base fin; and
a second bottom silicon germanium layer over the second base fin.

5. The semiconductor structure of claim 4,
wherein a bottommost one of the first number of nanostructures interfaces the first bottom silicon germanium layer,
wherein a bottommost one of the second number of nanostructures is vertically spaced apart from the second bottom silicon germanium layer.

6. The semiconductor structure of claim 4, wherein the second gate structure interfaces with a top surface of the second bottom silicon germanium layer.

7. The semiconductor structure of claim 1,
wherein a top surface of a topmost one of the first number of nanostructures is higher than a top surface of a topmost one of the second number of nanostructures.

8. The semiconductor structure of claim 1, wherein the dielectric fin comprises:
a first layer interfacing the isolation structure, the first gate structure, and the second gate structure;
a second layer enclosed by the first layer to be spaced apart from the isolation structure, the first gate structure, and the second gate structure; and
a third layer disposed over top surfaces of the first layer and the second layer.

9. The semiconductor structure of claim 8, wherein a composition of the first layer, a composition of the second layer, and a composition of the third layer are different from one another.

10. A semiconductor structure, comprising:
a substrate;
a first base fin and a second base fin arising from the substrate;
an isolation structure disposed over the substrate and between the first base fin and the second base fin;
a first number of channel features disposed over the first base fin;
a second number of channel features disposed over the second base fin;
a first gate structure wrapping around at least one of the first number of channel features; and
a second gate structure wrapping around each of the second number of features,
wherein the first number is greater than the second number,
wherein the first number of channel layers comprise silicon and a silicon content in the first number of channel layers is at least 90%,
wherein the second number of channel layers comprise silicon germanium and a germanium content in the second number of channel layers is between about 20% and about 50%.

11. The semiconductor structure of claim 10, further comprising:
a first bottom silicon germanium layer over the first base fin; and
a second bottom silicon germanium layer over the second base fin.

12. The semiconductor structure of claim 11, wherein a germanium content in the first bottom silicon germanium layer and the second bottom silicon germanium layer is between about 10% and about 20%.

13. The semiconductor structure of claim 11,
wherein a bottommost one of the first number of channel layers interfaces the first bottom silicon germanium layer,
wherein a bottommost one of the second number of channel layers is vertically spaced apart from the second bottom silicon germanium layer.

14. The semiconductor structure of claim 10, wherein a thickness of each of the first number of channel layers is the same as a thickness of each of the second number of channel layers.

15. The semiconductor structure of claim 10, further comprising:
a dielectric fin disposed over the isolation structure and sandwiched between the first gate structure and the second gate structure.

16. A semiconductor structure, comprising:
a substrate;
a first base fin and a second base fin arising from the substrate;
an isolation structure disposed over the substrate and between the first base fin and the second base fin;
a first bottom silicon germanium layer over the first base fin;
a second bottom silicon germanium layer over the second base fin;
a first number of nanostructures disposed over the first bottom silicon germanium layer;
a second number of nanostructures disposed over the second bottom silicon germanium layer;

a first gate structure wrapping around at least one of the first number of nanostructures; and a second gate structure wrapping around each of the second number of nanostructures, wherein the first number of nanostructures comprise silicon and a silicon content in the first number of nanostructures is at least 90%, wherein the second number of nanostructures comprise silicon germanium, wherein a germanium content in the second number of nanostructures is greater than a germanium content in the first bottom silicon germanium layer and the second bottom silicon germanium layer.

17. The semiconductor structure of claim 16, wherein the germanium content in the second number of nanostructures is between about 20% and about 50%.

18. The semiconductor structure of claim 16, wherein the germanium content in the first bottom silicon germanium layer and the second bottom silicon germanium layer is between about 10% and about 20%.

19. The semiconductor structure of claim 16, wherein a top surface of a topmost one of the first number of nanostructures is higher than a top surface of a topmost one of the second number of nanostructures.

20. The semiconductor structure of claim 16, wherein a bottommost one of the first number of nanostructures interfaces the first bottom silicon germanium layer, wherein a bottommost one of the second number of nanostructures is vertically spaced apart from the second bottom silicon germanium layer.

* * * * *